(12) United States Patent
Sugawara et al.

(10) Patent No.: US 11,355,629 B2
(45) Date of Patent: Jun. 7, 2022

(54) SEMICONDUCTOR DEVICE AND POWER CONVERTER

(71) Applicant: Mitsubishi Electric Corporation, Tokyo (JP)

(72) Inventors: Katsutoshi Sugawara, Tokyo (JP); Yutaka Fukui, Tokyo (JP); Kohei Adachi, Tokyo (JP); Hideyuki Hatta, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 529 days.

(21) Appl. No.: 16/480,676

(22) PCT Filed: Mar. 7, 2017

(86) PCT No.: PCT/JP2017/009007
§ 371 (c)(1),
(2) Date: Jul. 25, 2019

(87) PCT Pub. No.: WO2018/163286
PCT Pub. Date: Sep. 13, 2018

(65) Prior Publication Data
US 2021/0135002 A1    May 6, 2021

(51) Int. Cl.
*H01L 29/78* (2006.01)
*H01L 29/06* (2006.01)
(Continued)

(52) U.S. Cl.
CPC .......... *H01L 29/7813* (2013.01); *H01L 29/06* (2013.01); *H01L 29/0615* (2013.01);
(Continued)

(58) Field of Classification Search
CPC . H01L 29/06; H01L 29/0615; H01L 29/0619; H01L 29/0623; H01L 29/0696;
(Continued)

(56) References Cited

U.S. PATENT DOCUMENTS

2009/0200559 A1    8/2009  Suzuki et al.
2010/0224932 A1    9/2010  Takaya et al.
(Continued)

FOREIGN PATENT DOCUMENTS

JP    2005-142243 A    6/2005
JP    2007-242852 A    9/2007
(Continued)

OTHER PUBLICATIONS

International Search Report and Written Opinion dated Jun. 13, 2017 for PCT/JP2017/009007 filed on Mar. 7, 2017, 8 pages including English Translation of the International Search Report.

*Primary Examiner* — Gary L Laxton
(74) *Attorney, Agent, or Firm* — Xsensus LLP

(57) ABSTRACT

A silicon carbide semiconductor device includes a diffusion protective layer provided below a gate insulating film, a gate line provided on an insulation film on the bottom face of a terminal trench and electrically connected to a gate electrode, the terminal trench being located more toward the outer side than the gate trench, a gate pad joined to the gate line in the terminal trench, a terminal protective layer provided below the insulation film on the bottom face of the terminal trench, and a source electrode electrically connected to a source region, the diffusion protective layer, and the terminal protective layer. The diffusion protective layer has first extensions that extend toward the terminal protective layer and that are separated from the terminal protective layer. This configuration inhibits an excessive electric field from being applied to the gate insulating film provided on the bottom face of the gate trench.

11 Claims, 10 Drawing Sheets

(51) Int. Cl.
*H01L 29/417* (2006.01)
*H01L 29/739* (2006.01)
*H01L 29/66* (2006.01)
*H01L 29/423* (2006.01)
*H01L 29/12* (2006.01)
*H02M 7/5387* (2007.01)
*H01L 29/16* (2006.01)
*H01L 29/20* (2006.01)

(52) U.S. Cl.
CPC ...... *H01L 29/0619* (2013.01); *H01L 29/0623* (2013.01); *H01L 29/0696* (2013.01); *H01L 29/12* (2013.01); *H01L 29/41741* (2013.01); *H01L 29/4238* (2013.01); *H01L 29/66348* (2013.01); *H01L 29/66734* (2013.01); *H01L 29/739* (2013.01); *H01L 29/7397* (2013.01); *H01L 29/78* (2013.01); *H01L 29/7811* (2013.01); *H01L 29/1608* (2013.01); *H01L 29/2003* (2013.01); *H02M 7/53871* (2013.01)

(58) Field of Classification Search
CPC . H01L 29/12; H01L 29/1608; H01L 29/2003; H01L 29/41741; H01L 29/4238; H01L 29/66348; H01L 29/66734; H01L 29/739; H01L 29/7397; H01L 29/78; H01L 29/7811; H01L 29/7813; H02M 7/53871
See application file for complete search history.

(56) References Cited

U.S. PATENT DOCUMENTS

| | | | |
|---|---|---|---|
| 2011/0133269 A1* | 6/2011 | Yamaji | H01L 29/0615 257/E29.261 |
| 2013/0285140 A1 | 10/2013 | Kagawa et al. | |
| 2014/0252465 A1* | 9/2014 | Takaya | H01L 29/7827 257/330 |
| 2015/0171175 A1 | 6/2015 | Takaya et al. | |
| 2016/0163818 A1 | 6/2016 | Takeuchi et al. | |
| 2016/0190307 A1 | 6/2016 | Kagawa et al. | |
| 2017/0179109 A1* | 6/2017 | Toyoda | H01L 29/868 |
| 2019/0333986 A1* | 10/2019 | Fukui | H01L 29/7811 |

FOREIGN PATENT DOCUMENTS

| | | |
|---|---|---|
| JP | 2010-147222 A | 7/2010 |
| JP | 2013-258369 A | 12/2013 |
| JP | 2015-118966 A | 6/2015 |
| WO | 2012/077617 A1 | 6/2012 |
| WO | 2015/015808 A1 | 2/2015 |

* cited by examiner

SEMICONDUCTOR DEVICE AND POWER CONVERTER

CROSS-REFERENCE TO RELATED APPLICATION

The present application is based on PCT filing PCT/JP2017/009007, filed Mar. 7, 2017, the entire contents of which are incorporated herein by reference.

TECHNICAL FIELD

The present invention relates to a trench gate semiconductor device.

BACKGROUND ART

Insulated-gate type semiconductor devices such as metal oxide semiconductor field effect transistors (MOSFETs) and insulated gate bipolar transistors (IGBTs) have been widely used as switching elements for controlling power supply to loads such as motors in power electronics equipment. Examples of these insulated-gate type semiconductor devices include trench gate semiconductor devices in which a gate electrode is embedded in a semiconductor layer. As compared with planar semiconductor devices in which a gate electrode is formed on the surface of a semiconductor layer, the trench gate semiconductor devices can increase channel width density and thus can reduce on-state resistance per unit area. In the trench gate semiconductor devices, an electric field can easily concentrate on the bottom of the gate trench. Thus, some trench gate semiconductor devices include a diffusion protective layer of a second conductivity type different from a first conductivity type of a drift layer on the bottom of the gate trench so as to moderate the concentration of an electric field on the bottom of the gate trench and to inhibit a breakdown of a gate insulating film formed in the gate trench from being caused by an electric field.

Conventional semiconductor devices include an active region provided in the central portion of the semiconductor device and configured by a plurality of cells, and a terminal region provided surrounding the active region, wherein a gate trench is formed in a grid shape in the active region, and a terminal trench is formed surrounding the gate trench in the terminal region (see Patent Document 1, for example). The gate trench has extensions that extend from the inner side of the semiconductor device to the outer side thereof and that are connected at their ends to the terminal trench. Then, a diffusion protective layer is formed continuously from the bottom of the gate trench formed in the active region to the bottom of the terminal trench formed in the terminal region. With this configuration, in the OFF state of the semiconductor device, a depletion layer grows from the diffusion protective layer in the terminal region toward the drift layer in the active region. Thus, the withstand voltage of the semiconductor device can be improved by increasing an avalanche voltage across the diffusion protective layer formed on the bottom of the outermost gate trench in the active region. The diffusion protective layer and the source electrode are joined to each other at the bottom of the terminal trench so that, when the semiconductor device is turned on, carriers in the depletion layer, which has grown to the drift layer, are brought back to the diffusion protective layer by the source potential at the source electrode. This suppresses an increase in switching loss.

PRIOR ART DOCUMENT

Patent Document

Patent Document 1: International Publication No. 2015/015808

SUMMARY

Problems to be Solved by the Invention

With the conventional semiconductor device described in Patent Document 1, however, the diffusion protective layer provided on the bottom of the gate trench in the active region is formed continuously with the diffusion protective layer provided on the bottom of the terminal trench in the terminal region. Thus, a displacement current that flows to the diffusion protective layer in accordance with a switching operation of the semiconductor device flows into the active region from the terminal region. As a result, the displacement current and the electric resistance of the diffusion protective layer cause an excessive voltage drop in the diffusion protective layer on the bottoms of the extensions of the gate trench connected to the terminal trench, and an excessive electric field is applied to the gate insulating film provided on the bottom of the gate trench. Thus, there has been a problem in that a breakdown of the gate insulating film may occur.

The present invention has been made in light of the problem described above, and it is an object of the present invention to provide a semiconductor device that prevents a displacement current from flowing into the active region from the terminal region in accordance with the switching operation of the semiconductor device and inhibits an excessive electric field from being applied to the gate insulating film provided on the bottom face of the gate trench.

Means to Solve the Problem

The semiconductor device according to the present invention includes a semiconductor substrate, a drift layer of a first conductivity type provided on the semiconductor substrate, a base region of a second conductivity type provided on the drift layer, a source region of the first conductivity type provided in an upper portion of the base region, a gate electrode provided in a gate trench that penetrates the source region and the base region and reaches the drift layer, a gate insulating film provided between a bottom face of the gate trench and the gate electrode, a diffusion protective layer of the second conductivity type provided below the gate insulating film, an insulation film provided on a bottom face of a terminal trench that is located more toward the outer side of the semiconductor substrate than the gate trench, a gate line provided on the insulation film and electrically connected to the gate electrode, a gate pad joined to the gate line in the terminal trench, a terminal protective layer of the second conductivity type provided below the insulation film, and a source electrode electrically connected to the source region, the diffusion protective layer, and the terminal protective layer. The diffusion protective layer has a first extension that extends toward the terminal protective layer, and the first extension is separated from the terminal protective layer.

Effects of the Invention

With the semiconductor device according to the present invention, the diffusion protective layer provided below the gate insulating film has extensions that extend toward the terminal protective layer provided below the insulation film on the bottom face of the terminal trench, and these extensions are separated from the terminal protective layer. Thus, it is possible to prevent a displacement current from flowing into the diffusion protective layer from the terminal protective layer and to inhibit an excessive electric field from being applied to the gate insulating film.

BRIEF DESCRIPTION OF DRAWINGS

FIG. 6 includes

DESCRIPTION OF EMBODIMENTS

Embodiment 1

Figure 1:
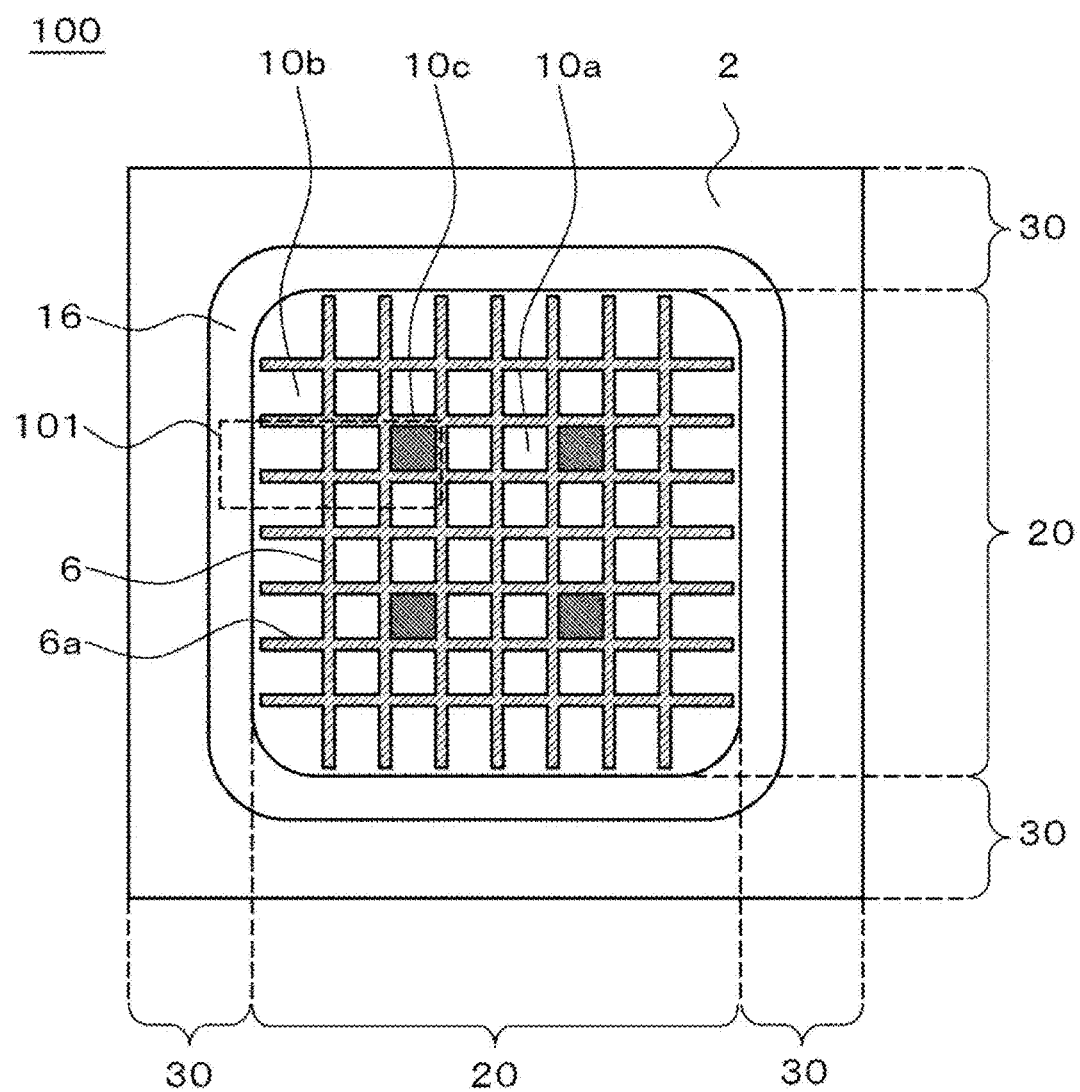
FIG. 1 is a plan view illustrating a semiconductor device according to Embodiment 1 of the present invention.

First, a configuration of a semiconductor device according to Embodiment 1 of the present invention will be described. FIG. 1 is a plan view illustrating a semiconductor device according to Embodiment 1 of the present invention. In FIG. 1, the semiconductor device 100 includes an active region 20 provided in the central portion of the semiconductor device 100 in plan view, and a terminal region 30 provided around the active region 20.

Note that the active region 20 according to the present invention refers to a region where current flows as a result of a channel being formed in the ON state of the semiconductor device 100, and the terminal region 30 refers to a region around the active region 20. The terminal region 30 is provided surrounding the active region 20 in the outer peripheral portion of the semiconductor device 100. A gate trench 6 is formed in the active region 20, and a terminal trench 16 is formed in the terminal region 30. In the plan view illustrated in FIG. 1, an inner region surrounded by the terminal trench 16 corresponds to the active region 20, and the inner peripheral edge of the terminal trench 16 corresponds to the boundary between the active region 20 and the terminal region 30. Although the terminal trench 16 in FIG. 1 has an endless ring shape that continuously surrounds the active region 20, the terminal trench 16 may be provided intermittently around the active region 20.

An impurity concentration according to the present invention refers to a peak value of the impurity concentration in each region. In the plan view of the semiconductor device 100 illustrated in FIG. 1, the outer side refers to a direction from the inside of the semiconductor device 100 toward the outside of the semiconductor device 100, and the inner side refers to a direction opposite to the outer side. Accordingly, in partial plan views and partial sectional views of semiconductor devices illustrated in FIGS. 2A to 9D, the direction from the right to the left in the drawing refers to the outer side, and the direction from the left to the right in the drawing refers to the inner side. The terminal region 30 is provided more toward the outer side of the semiconductor device 100 than the active region 20.

Although a first conductivity type is described as an n type and a second conductivity type as a p type in the present invention, the first conductivity type may be a p type and the second conductivity type may be an n type in the semiconductor device. Although the present invention takes the example of the case where the semiconductor device is an MOSFET, the semiconductor device may be an IGBT. Also, although the present invention takes the example of the case where a drift layer included in a semiconductor layer 2 is formed of silicon carbide (SiC), the drift layer may be formed of a wide bandgap semiconductor having a wider bandgap than silicon, such as gallium nitride (GaN) or diamond.

In FIG. 1, the semiconductor layer 2 of the semiconductor device 100 has the gate trench 6 formed in the active region 20 and the terminal trench 16 formed surrounding the gate trench 6 and separated from the gate trench 6 in the terminal region 30. As illustrated in FIG. 1, the gate trench 6 is formed in a grid shape, and the gate trench 6 has a plurality of extensions 6a that extend from the inner side of the semiconductor layer 2 to the outer side thereof, i.e., extend toward the terminal trench. The tips of the extensions 6a are separated from the terminal trench 16. A plurality of cells is formed in parcels of the active region 20 partitioned by the gate trench 6. As illustrated in FIG. 1, the plurality of cells includes active cells 10a, outermost cells 10b, and contact cells 10c. Among them, the active cells 10a and the outermost cells 10b are cells that function as MOSFETs, and the contact cells 10c are cells that establish electrical connection between a source electrode and a diffusion protective layer that is formed on the bottom of the gate trench 6, as will be described later. For example, all the active cells 10a may be formed adjacent to the contact cells 10c as illustrated in FIG. 1. Alternatively, the outermost cells 10b may be adjacent to the contact cells 1oc.

Although FIG. 1 illustrates the case where the active cells 10a, the outermost cells 10b, and the contact cells 10c, i.e., the respective cells, have a quadrangular shape, the shape of each cell may be a circular shape or a polygonal shape such as a hexagonal shape. The arrangement of the cells is not limited to an array of uniform squares illustrated in FIG. 1 and may be a staggered array. As another alternative, the gate trench 6 may be formed in a stripe shape having extensions that extend from the inner side of the semiconductor device 100 to the outer side thereof, and each cell may also be formed in a stripe shape. There is no particular need to clearly distinguish between the active cells 10a and the outermost cells 10, and for example, a region of stripe-shaped active cells 10 that is close to the terminal region may be referred to as an outermost region, instead of providing the outermost cells 10b. Moreover, a configuration is also possible in which the contact cells 10c are not provided, and for example, a region of the same conductivity type as that of the diffusion protective layer is formed in part of the semiconductor layer that is in contact with the side face of the gate trench 6, so as to electrically connect the source electrode and a diffusion protective layer described later.

Figure 2A:
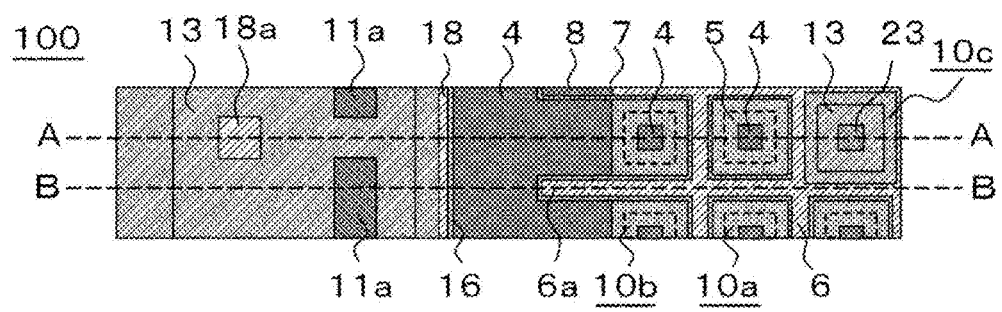
FIGS. 2A and 2B are partial plan views and FIGS. 2C and 2D are partial sectional views each illustrating part of a configuration of the semiconductor device according to Embodiment 1 of the present invention.
Figure 2B:
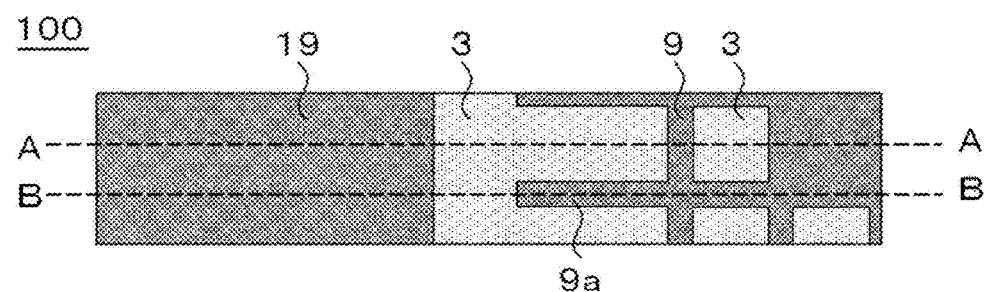
Figure 2C:
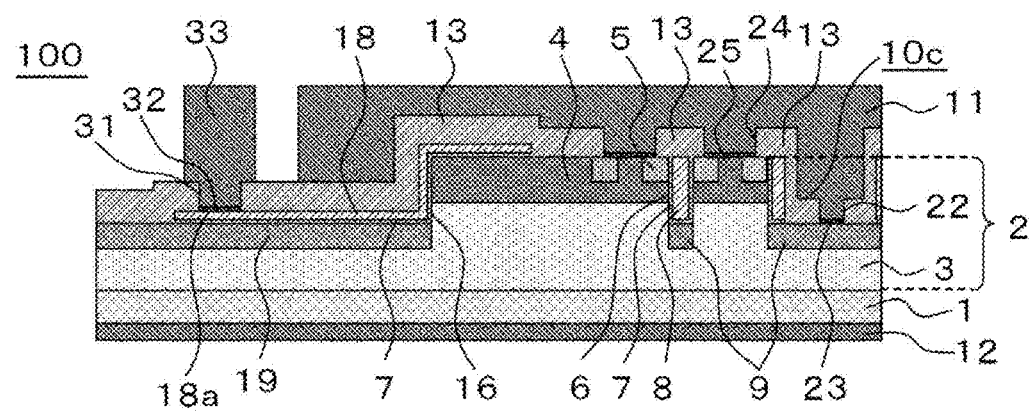
Figure 2D:
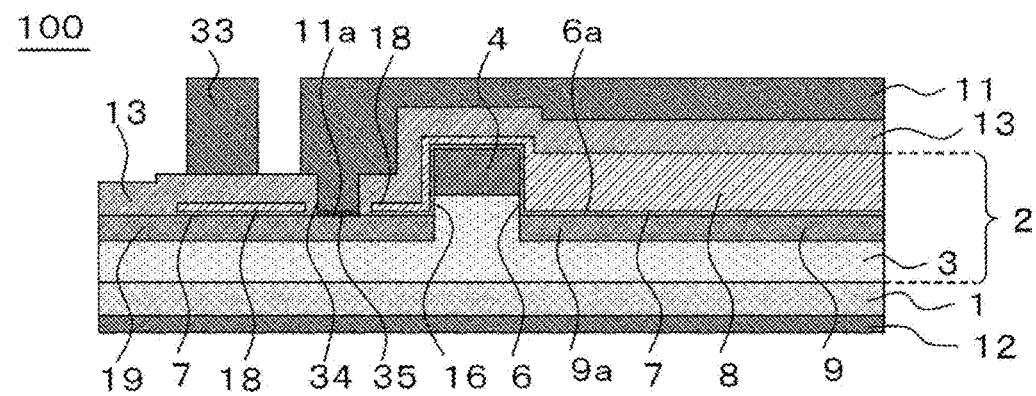

FIGS. 2A and 2B are partial plan views and FIGS. 2C and 2D are partial sectional views each illustrating part of the configuration of the semiconductor device according to Embodiment 1 of the present invention. The partial plan views and partial sectional views in FIGS. 2A to 2D illustrate the configuration of a region enclosed by a broken line 101 in FIG. 1. FIG. 2A is a partial plan view illustrating the semiconductor device 100 taken at a position of the upper surface of the semiconductor layer 2, and FIG. 2B is a partial plan view illustrating the semiconductor device 100 taken at a position of the diffusion protective layer 9 on the bottom of the gate trench 6. FIG. 2C is a partial sectional view taken along a broken line A-A in FIGS. 2A and 2B, and FIG. 2D is a partial sectional view taken along a broken line B-B in FIGS. 2A and 2B.

As illustrated in FIGS. 2C and 2D, the semiconductor device 100 serving as an MOSFET includes an n-type silicon carbide semiconductor substrate 1 and the semiconductor layer 2 that is epitaxially grown on the silicon carbide semiconductor substrate 1. The active region of the semiconductor layer 2 has formed therein a drift layer 3 formed of an n-type silicon carbide semiconductor, a p-type base region 4 provided on the drift layer 3, an n-type source region 5 selectively provided in the upper portion of the base region 4, a gate trench 6 provided through the source region 5 and the base region 4 and having a bottom face located in the drift layer 3, and a p-type diffusion protective layer 9 provided below the bottom face of the gate trench 6. The terminal region of the semiconductor layer 2, on the other hand, has formed therein the terminal trench 16 having a bottom face located at a deeper position than the base region 4 in the n-type drift layer 3, and a p-type terminal protective layer 19 provided below the bottom face of the terminal trench 16. In the case where the semiconductor device 100 is an IGBT, the conductivity type of the silicon carbide semiconductor substrate 1 is set to a p type.

Here, the drift layer 3 may have an n-type impurity concentration of $1\times10^{14}$ cm$^{-3}$ to $1\times10^{17}$ cm$^{-3}$ and a thickness of 5 to 200 μm. The p-type impurity concentration of the base region 4 may be in the range of $1\times10^{17}$ cm$^{-3}$ to $1\times10^{20}$ cm$^{-3}$. The n-type impurity concentration of the source region 5 may be higher than or equal to the p-type impurity concentration of the base region 4 and less than or equal to $1\times10^{21}$ cm$^{-3}$. The p-type impurity concentrations of the diffusion protective layer 9 and the terminal protective layer 19 may be in the range of $1\times10^{17}$ cm$^{-3}$ to $1\times10^{19}$ cm$^{-3}$. The p-type impurity concentration of the diffusion protective layer 9 is preferably the same as the p-type impurity concentration of the terminal protective layer 19 or higher than or equal to the p-type impurity concentration of the terminal protective layer 19.

As illustrated in FIG. 2A, the gate trench 6, the active cells 10a, the outermost cells 10b, and the contact cells 10c are formed in the active region of the semiconductor device 100.

As illustrated in FIGS. 2A and 2C, a gate insulating film 7 is formed on the inner side face and bottom face of the gate trench 6, and a gate electrode 8 formed of polysilicon is embedded in the gate trench 6 via the gate insulating film 7. The gate electrode 8 embedded in the gate trench 6 opposes the source region 5, the base region 4, and the drift layer 3 via the gate insulating film 7. As illustrated in FIG. 2C, the bottom face of the gate electrode 8 is located in the drift layer 3 in the depth direction of the semiconductor layer 2.

As illustrated in FIG. 2A, the gate trench 6 is formed in a grid shape in plan view and has extensions 6a that are located adjacent to the outermost cells 10b and extend from the inner side of the silicon carbide semiconductor substrate 1 to the outer side thereof. The gate trench 6 and the terminal trench 16 are formed apart from each other, and the tips of the extensions 6a of the gate trench 6 are separated from the terminal trench 16.

As illustrated in FIG. 2B, the diffusion protective layer 9 has approximately the same shape as the gate trench 6, i.e., a grid shape in plan view, and has extensions 9a that extend from the inner side of the silicon carbide semiconductor substrate 1 to the outer side thereof, like the gate trench 6. The terminal protective layer 19 also has approximately the same shape as the terminal trench 16 in plan view. The diffusion protective layer 9 and the terminal protective layer 19 are formed apart from each other, and the terminal protective layer 19 is provided apart from the extensions 9a in the extension direction of the extensions 9a of the diffusion protective layer 9. As illustrated in FIG. 2B, the terminal protective layer 19 has a portion located in the extension direction of the extensions 9a of the diffusion protective layer 9 in plan view, and the length of that portion parallel to the width of the extensions 9a is greater than the width of the extensions 9a of the diffusion protective layer 9.

Also, as illustrated in FIGS. 2C and 2D, the diffusion protective layer 9 is provided below the gate insulating film 7 provided on the bottom face of the gate trench 6, and is more preferably provided in contact with the gate insulating film 7. The terminal protective layer 19 is provided below the gate insulating film 7 provided on the bottom face of the terminal trench 16, and is more preferably provided in contact with the gate insulating film 7 located on the bottom face of the terminal trench 16. The drift layer 3 is provided between the diffusion protective layer 9 and the terminal protective layer 19. Since the diffusion protective layer 9 and the terminal protective layer 19 are of the p type and the drift layer 3 is of the n type, the diffusion protective layer 9 and the terminal protective layer 19 are configured not to be electrically connected to each other in the semiconductor layer 2 and not to pass current via the drift layer 3. The diffusion protective layer 9 and the terminal protective layer 19 are electrically connected to each other only via the source electrode 11 formed outside the semiconductor layer 2.

As illustrated in FIG. 2C, the contact cells 10c are formed in their entirety in the gate trench 6. The diffusion protective layer 9 is also formed in the drift layer 3 that is adjacent to the bottom of the gate trench 6 in which the contact cells 10c are formed. In the contact cells 10c, an interlayer insulation film 13 is formed on the inside surrounded by the gate electrode 8 and on the bottom of the gate trench 6. The interlayer insulation film 13 formed on the bottom of the gate trench 6 has contact holes 22 that extend from the inside of the contact cells 10c surrounded by the interlayer insulation film 13 to the diffusion protective layer 9. A source electrode 11 is provided on the inside of the contact cells 10c surrounded by the interlayer insulation film 13, and the source electrode 11 is joined to the diffusion protective layer 9 via the contact holes 22. The contact cells 10c have a junction at which the diffusion protective layer 9 and the source electrode 11 are joined. Note that an ohmic electrode 23 may be provided between the source electrode 11 and the diffusion protective layer 9 in order to form an ohmic junction between the metal and the semiconductor.

According to the present invention, in the case where an ohmic electrode is provided between the source electrode and the semiconductor, the source electrode and the ohmic electrode may collectively be referred to as a source electrode, without making a distinction between the source electrode and the ohmic electrode. Similarly, in the case where an ohmic electrode is provided between a gate pad serving as a metal electrode and a gate line formed of, for example, a semiconductor, the gate pad and the ohmic electrode may collectively be referred to as a gate pad, without making a distinction between the gate pad and the ohmic electrode. That is, the source electrode and the gate pad according to the present invention are not limited to those formed of only a single metal, and may be configured to include a material suitable for joining with a semiconductor at the junction with the semiconductor. The ohmic electrodes are not limited to a metal, and may be a compound of metal with semiconductor, e.g., silicide. As another alternative, the ohmic electrodes may be configured by a conductor such as a multi-layered metal or a semiconductor.

As illustrated in FIG. 2C, the source region 5 is provided in the upper portion of the base region 4 in the active cells 10a and the outermost cells 10b, and the source region 5 opposes the gate electrode 8 via the gate insulating film 7. The source region 5 is not provided in the entire upper portion of the base region 4, and the source region 5 is selectively provided in the upper layer portion of the semiconductor layer 2. The source region 5 and the base region 4 are joined to the source electrode 11 and electrically connected to the source electrode 11 at the surface of the semiconductor layer 2. Note that the p-type impurity concentration of the base region 4 on the side of the source electrode 11 may be set higher than the p-type impurity concentration thereof on the side of the drift layer 3 in order to reduce contact resistance between the base region 4 and the source electrode 11.

As illustrated in FIGS. 2C and 2D, the interlayer insulation film 13 is formed on the surface of the semiconductor layer 2 and on the gate trench 6. As illustrated in FIG. 2C, the interlayer insulation film 13 has contact holes 24 in a region that includes part of the base region 4 and the source region 5 in the active cells 10a and the outermost cells 10b in plan view. The source electrode 11 is joined to the base region 4 and the source region 5 in the active cells 10a and the outermost cells 10b via the contact holes 24 formed in the interlayer insulation film 13. Note that an ohmic electrode 25 may be provided at junctions between the source electrode 11 and the base and source regions 4 and 5.

As illustrated in FIG. 2A, since the gate trench 6 is formed apart from the terminal trench 16 on the outermost side of the active region, the end of the gate trench 6 that opposes the terminal region has a plurality of extensions 6a that protrude toward the terminal region. As illustrated in FIG. 2B, the diffusion protective layer 9 located below the gate insulating film 7 provided on the bottom face of the gate trench 6 also has a plurality of extensions 9a that protrude toward the terminal region. As illustrated in FIG. 2A, the source region 5 in the outermost cells 10b is not formed to reach the tips of the extensions 6a of the gate trench 6 that protrude toward the terminal region, so that the tips of the extensions 6a of the gate trench 6 that protrude toward the terminal region are closer to the terminal region than the end of the source region 5. Therefore, as illustrated in FIG. 2B, the outer tips of the extensions 9a of the diffusion protective layer 9 that extend from the inner side to the outer side are also located more toward the outer side of the silicon carbide semiconductor substrate 1 than the source region 5 adjacent to the extensions 9a of the diffusion protective layer 9 in plan view.

Since the diffusion protective layer 9 in the active region is formed at the bottom of the gate trench 6, a too-wide interval between the diffusion protective layer 9 and the terminal protective layer 19 in the terminal region is not desirable because a region where the depletion layer cannot reach arises in the OFF state, and this reduces the withstand voltage of the semiconductor device 100. On the other hand, if the end of the source region 5 in the outermost cells 10b is too close to the terminal trench 16, an electric field can easily cause a breakdown of the gate insulating film 7 in the terminal trench 16. Therefore, as illustrated in FIGS. 2A and 2B, the distance between the extensions 9a of the diffusion protective layer 9 and the terminal protective layer 19 in plan view is set shorter than the distance between the source region 5 in the outermost cells 10b and the terminal protective layer 19. This inhibits a breakdown of the gate insulating film 7 provided on the side face of the terminal trench 16 from being caused by an electric field while suppressing a reduction in withstand voltage in the OFF state.

As illustrated in FIG. 2D, the gate electrode 8 provided via the gate insulating film 7 in the extensions 6a of the gate trench 6 that protrude toward the terminal region is connected to a gate line 18 at the end of the gate trench 6. The gate line 18 is guided along the top of the base region 4, i.e., the top of the semiconductor layer 2, to the interior of the terminal region and joined to the gate pad 33 in the terminal trench 16 along the inside of the terminal trench 16. The gate line 18 is formed integrally in the step of forming the gate electrode 8, so that the gate line 18 is formed of polysilicon that constitutes the gate electrode 8. It is, however, noted that the gate electrode 8 and the gate line 18 may be formed separately in different steps, and the material for the gate electrode 8 and the material for the gate line 18 may be different materials. The gate insulating film 7 is formed between the gate line 18 and the semiconductor layer 2.

As illustrated in FIGS. 2C and 2D, the terminal trench 16 is formed in the terminal region of the semiconductor device 100, and the p-type terminal protective layer 19 is formed at the bottom of the terminal trench 16. The bottom face of the terminal trench 16 is located in the drift layer 3, and the terminal protective layer 19 is formed in the drift layer 3 that is adjacent to the gate insulating film 7 on the bottom face of the terminal trench 16. Although the terminal trench 16 and the gate trench 6 are formed apart from each other in FIG. 2, the terminal trench 16 and the gate trench 6 may be formed continuously in the configuration. However, even if the terminal trench 16 and the gate trench 6 are formed continuously in the configuration, the diffusion protective layer 9 and the terminal protective layer 19 are formed apart from each other, with the drift layer 3 sandwiched therebetween.

The terminal trench 16 may be formed to a different depth from that of the gate trench 6, but from a manufacturing process viewpoint, the terminal trench 16 is preferably formed to the same depth as that of the gate trench 6. In the case where the terminal trench 16 is formed to a different depth from that of the gate trench 6, the terminal protective layer 19 is also formed to a different depth from that of the diffusion protective layer 9. The terminal protective layer 19 is preferably formed to the same depth as that of the diffusion protective layer 9 or to a depth deeper than the depth of the diffusion protective layer 9. This helps suppressing the concentration of an electric field on the extensions 9a of the diffusion protective layer 9 provided at the bottom of the gate trenches in the outermost cells 10b and improving the withstand voltage of the semiconductor device 100. That is, the length between the bottom face of the terminal trench 16 and the silicon carbide semiconductor substrate 1 is preferably less than or equal to the length between the bottom face of the gate trench 6 and the silicon carbide semiconductor substrate 1. Also, the terminal protective layer 19 and the diffusion protective layer 9 may have different thicknesses, but they preferably have the same thickness from a manufacturing process viewpoint. Moreover, the terminal protective layer 19 and the diffusion protective layer 9 may have different p-type impurity concentrations, but they preferably have the same p-type impurity concentration from a manufacturing process viewpoint.

As illustrated in FIG. 2D, the surface of the semiconductor layer 2 in the terminal region of the semiconductor device 100 is also covered with the interlayer insulation film 13, but the interlayer insulation film 13 in the terminal region has a contact hole 34 that reaches the terminal protective layer 19. The source electrode 11 formed continuously from the active region is joined to the terminal protective layer 19 via the contact hole 34, which forms a junction 11a between the source electrode 11 and the terminal protective layer 19. Alternatively, an ohmic electrode 35 may be provided between the source electrode 11 and the terminal protective layer 19. Also, as illustrated in FIG. 2C, the interlayer insulation film 13 in the terminal region has a contact hole 31 that reaches the gate line 18, and the gate pad 33 is joined to the gate line 18 via the contact hole 31, which forms a junction 18a. Alternatively, an ohmic electrode 32 may be provided between the gate pad 33 and the gate line 18.

As illustrated in FIG. 2A, the junction 11a between the source electrode 11 and the terminal protective layer 19 is provided to surround the active region, but the junction 11a is partly divided because the junction 18a between the gate pad 33 and the gate line 18 is located more toward the outer side than the junction 11a between the source electrode 11 and the terminal protective layer 19. Through this divided portion, the gate line 18 is connected from the inside to outside of the region of the source electrode 11 surrounded by the junction 11a, and the gate electrode 8 in the gate trench 6 and the gate pad 33 are electrically connected to each other.

As illustrated in FIGS. 2C and 2D, the diffusion protective layer 9 in the active region and the terminal protective layer 19 in the terminal region are electrically connected to each other only via the source electrode 11 outside the semiconductor layer 2, and accordingly no current flows between the diffusion protective layer 9 and the terminal protective layer 19 inside the semiconductor layer 2. On the side of the silicon carbide semiconductor substrate 1 opposite to the side where the semiconductor layer 2 is provided, a drain electrode 12 is provided.

As described above, the semiconductor device 100 is configured.

The semiconductor device according to the present invention may be configured to include a terminal field relieving layer that functions as a guard ring and that is located more toward the outer side than the terminal protective layer 19 in the terminal region.

Figure 3A:
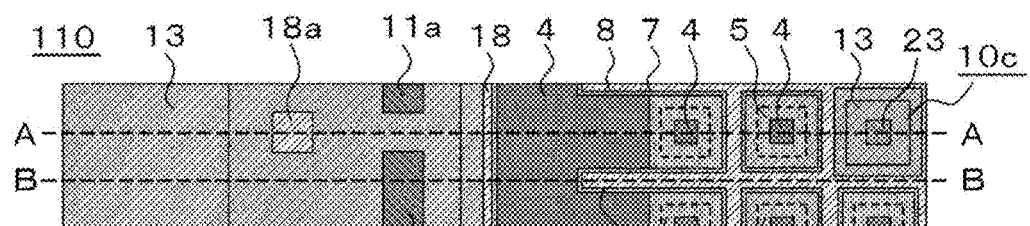
FIGS. 3A and 3B are partial plan views and FIGS. 3C and 3D are partial sectional views each illustrating a semiconductor device 110 according to a variation of Embodiment 1 of the present invention.
Figure 3B:
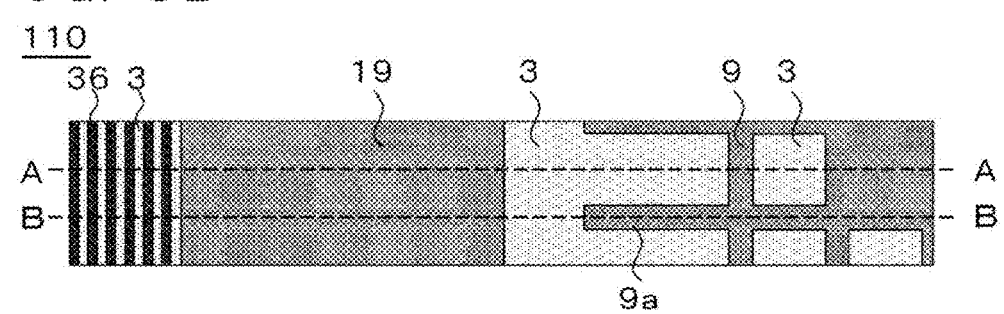
Figure 3C:
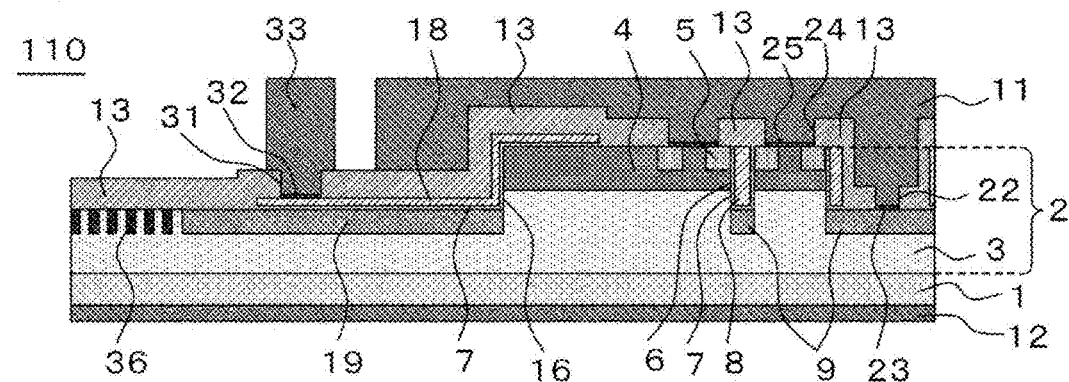
Figure 3D:
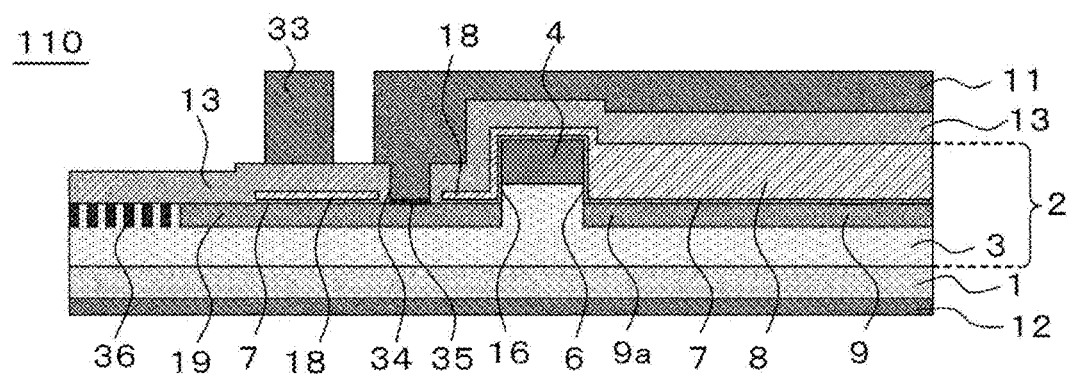

FIGS. 3A and 3B are partial plan views and FIGS. 3C and 3D are partial sectional views each illustrating a semiconductor device 110 according to a variation of Embodiment 1 of the present invention. FIGS. 3A to 3D illustrate the same region as in FIGS. 2A to 2D that corresponds to the region enclosed by the broken line 101 in FIG. 1, and constituent elements given the same reference signs as in FIGS. 2A to 2D indicate identical or corresponding constituent elements, and description thereof has been omitted. The semiconductor device 110 in FIGS. 3A to 3D differs from the semiconductor device 100 in FIGS. 2A to 2D in its configuration in which a p-type terminal field relieving layer 36 that functions as a guard ring is provided more toward the outer side than the terminal protective layer 19.

FIG. 3A is a partial plan view illustrating the semiconductor device 110 taken at the position of the upper surface of the semiconductor layer 2, and FIG. 3B is a partial plan view illustrating the semiconductor device 110 taken at the position of the diffusion protective layer 9 formed at the bottom of the gate trench 6. FIG. 3C is a partial sectional view taken along a broken line A-A in FIGS. 3A and 3B, and FIG. 3D is a partial sectional view taken along a broken line B-B in FIGS. 3A and 3B.

As illustrated in FIGS. 3A to 3D, the terminal field relieving layer 36 is provided more toward the outer side than the terminal protective layer 19 and sandwiches the drift layer 3 between the terminal protective layer 19 and itself. Alternatively, a plurality of terminal field relieving layers 36 may be formed toward the outer side, with the drift layer 3 sandwiched therebetween. The p-type impurity concentration of the terminal field relieving layer 36 is preferably the same as the p-type impurity concentration of the terminal protective layer 19 or lower than or equal to the p-type impurity concentration of the terminal protective layer 19. In the case where a plurality of terminal field relieving layers 36 is formed around the terminal protective layer 19, the plurality of terminal field relieving layers 36 may have different p-type impurity concentrations and may have different widths or depths. Unlike the terminal protective layer 19, the terminal field relieving layer 36 does not necessarily have to be electrically connected to the source electrode 11.

In this way, the semiconductor device 110 illustrated in FIGS. 3A to 3D includes the terminal field relieving layer 36 located more toward the outer side than the terminal protective layer 19. Thus, a depletion layer extending from the terminal field relieving layer 36 enables suppressing an avalanche breakdown and further improving the withstand voltage of the semiconductor device 110.

Next, a method of manufacturing the semiconductor device 100 according to the present invention will be described. The semiconductor device 110 illustrated as a variation can also be manufactured by the same method.

FIGS. 4A to 5D are diagrams illustrating the method of manufacturing a semiconductor device according to Embodiment 1 of the present invention. FIGS. 4A to 4D include diagrams illustrating steps until the diffusion protective layer 9 is formed at the bottom of the gate trench 6 and the terminal protective layer is formed at the bottom of the terminal trench 16, and FIGS. 5A to 5D include diagrams illustrating steps until the semiconductor device 100 is completed after the formation of the diffusion protective layer 9 and the terminal protective layer 19.

Figure 4A:
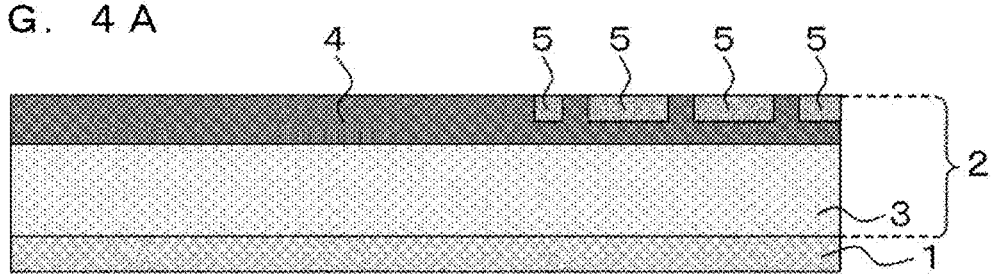
FIGS. 4A to 4D illustrate a method of manufacturing the semiconductor device according to Embodiment 1 of the present invention.

First, as illustrated in FIG. 4A, the n-type silicon carbide semiconductor substrate 1 with a 4H polytype is prepared, and the n-type semiconductor layer 2 is epitaxially grown thereon by chemical vapor deposition (CVD). At this time, the n-type impurity concentration of the n-type semiconductor layer 2 is set in the range of $1\times10^{14}$ cm$^{-3}$ to $1\times10^{17}$ cm$^{-3}$, and the thickness thereof is set in the range of 5 to 200 μm.

Next, aluminum (Al) ions serving as a p-type impurity are implanted in the surface of the epitaxially grown semiconductor layer 2 so as to form the base region 4. The implantation depth of Al ions is set to a range that does not exceed the thickness of the semiconductor layer 2 and is set in the range of 0.3 to 3 μm. The impurity concentration of Al ions to be implanted is set higher than the n-type impurity concentration of the epitaxially grown semiconductor layer 2, and the p-type impurity concentration of the base region 4 is set in the range of $1\times10^{17}$ cm to $1\times10^{20}$ cm$^{-3}$. As a result, a region of the semiconductor layer 2 that has a greater depth than the implantation depth of Al ions, other than the base region 4, forms the n-type drift layer 3. Note that the base region 4 may be formed by epitaxially growing a p-type semiconductor, and in that case, the p-type impurity concentration and thickness of the base region 4 may be the same as those of the base region 4 formed by ion implantation.

Next, nitrogen (N) ions serving as an n-type impurity are selectively implanted in the surface of the base region 4 to form the source region 5. The source region 5 is formed into a pattern that corresponds to the layout of the gate electrode 8 that is formed in a subsequent step. The implantation depth of N ions is set smaller than the thickness of the base region 4. The impurity concentration of N ions to be implanted is set higher than or equal to the p-type impurity concentration of the base region 4 and lower than or equal to $1\times10^{21}$ cm$^{-3}$.

Note that the sequence of the step of implanting Al ions to form the base region 4 and the step of implanting N ions to form the source region 5 may be changed. Alternatively, the steps may be performed such that, after an n-type semiconductor layer is formed by implanting N ions in the entire upper portion of the base region 4, a portion of the n-type semiconductor layer that is to be left as the source region 5 is masked, and Al ions are implanted again in a non-masked portion other than the source region 5 so as to turn this non-masked portion back to the p-type base region 4. At this time, the impurity concentration of Al ions to be implanted again may be set higher than the impurity concentration of Al in the portion of the base region 4 that is located adjacent to the drift layer 3, in order to reduce contact resistance with the source electrode.

Figure 4B:
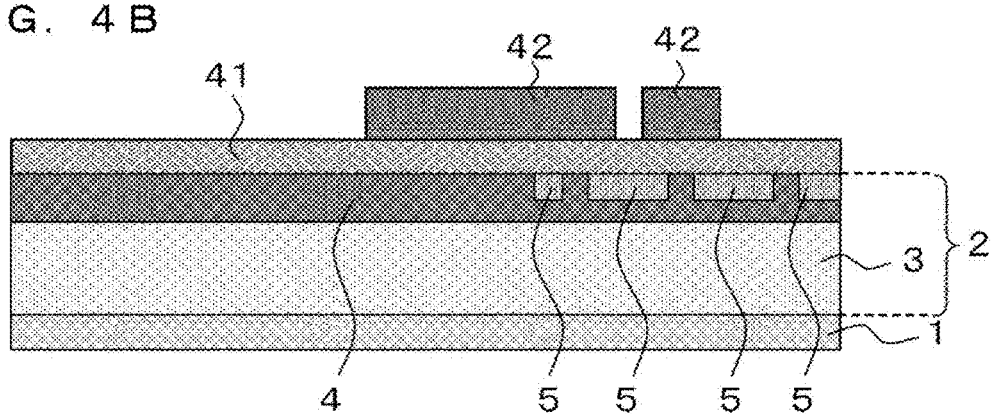

Next, as illustrated in FIG. 4B, a silicon oxide film 41 and an etching mask 42 are formed on the surface of the semiconductor layer 2. The silicon oxide film 41 is formed by deposition to a thickness of 1 to 2 μm, and the etching mask 42 is formed on the silicon oxide film 41. The etching mask 42 has a pattern formed by a photolithographic technique, the pattern exposing regions where the gate trench 6 and the terminal trench 16 are to be formed.

Next, the silicon oxide film 41 is patterned by reactive ion etching (RE) using the etching mask 42 as a mask. That is, the pattern of the etching mask 42 is transferred to the silicon oxide film 41, and the silicon oxide film 41 is used as an etching mask for the semiconductor layer 2.

Figure 4C:
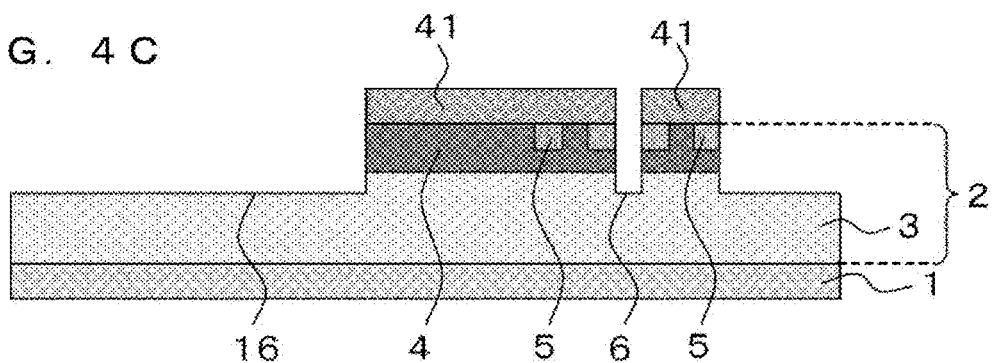
Figure 4D:
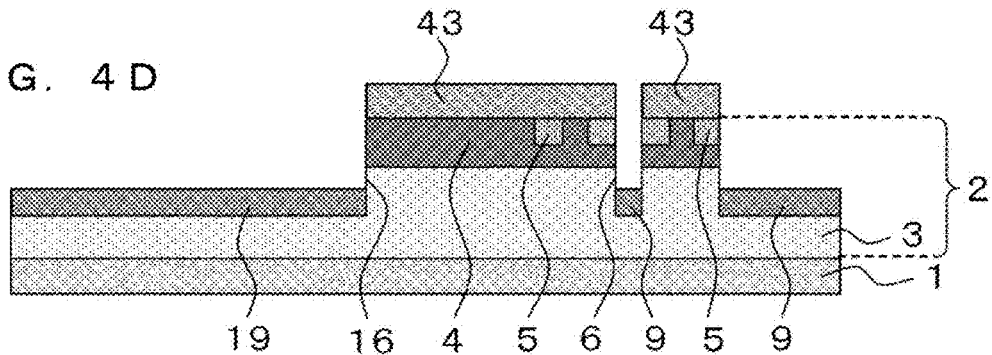

Next, as illustrated in FIG. 4C, the gate trench 6 that penetrates the source region 5 and the base region 4 and the terminal trench 16 that penetrates the base region 4 are formed in the semiconductor layer 2 by ME using the patterned silicon oxide film 41 as a mask. The depths of the gate trench 6 and the terminal trench 16 are greater than or equal to the depth of the base region 4, which is formed in the semiconductor layer 2 by ion implantation, and may be in the range of 1.0 to 6.0 μm.

Since the silicon oxide film 41 is removed by the formation of the gate trench 6 and the terminal trench 16, an implantation mask 43 having an opening of the same pattern as that of the silicon oxide film 41 is formed after the formation of the gate trench 6 and the terminal trench 16, and the p-type diffusion protective layer 9 and the p-type terminal protective layer 19 are formed by implanting Al ions in the drift layer 3 at the bottoms of the gate trench 6 and the terminal trench 16. Preferably, the impurity concentration of Al ions to be implanted is in the range of $1\times10^{17}$ cm$^{-3}$ to $1\times10^{19}$ cm$^{-3}$, and the implantation depth of the ions is in the range of 0.1 to 2.0 μm. The impurity concentration of Al ions to be implanted may be determined by an electric field that is applied to the gate insulating film 7 in the case where the same voltage as the withstand voltage of the semiconductor device 100 is applied between the drain electrode 12 and source electrode 11 of the semiconductor device 100.

If etching conditions and the thickness of the silicon oxide film 41 are controlled such that the silicon oxide film 41 remains even after having been used as a mask to form the gate trench 6 and the terminal trench 16, the remaining silicon oxide film 41 can be used to form the diffusion protective layer 9 and the terminal protective layer 19, instead of the implantation mask 43. This simplifies the manufacturing process and reduces the manufacturing cost.

Also, if Al ions are implanted in an oblique direction with respect to the opening of the gate trench 6 when forming the diffusion protective layer 9, it is possible to form a p-type semiconductor layer in the drift layer 3 that is in contact with the side face of the gate trench 6 and to use the p-type semiconductor layer to connect the p-type diffusion protective layer 9 and the p-type base region 4. Note that this p-type semiconductor layer formed in the drift layer 3 in contact with the side face of the gate trench 6 is formed apart from the terminal protective laver 19. In this case, the diffusion protective layer 9 and the source electrode 11 can be electrically connected to each other, without providing the contact cells 1c described previously.

After the formation of the diffusion protective layer 9 and the terminal protective layer 19, the implantation mask 43 used in ion implantation is removed, and the implanted impurity ions are subjected to annealing for activation using a heat treatment apparatus. The annealing is performed at a temperature of 1300° C. to 1900° C. for 30 seconds to one hour in a vacuum or an inert-gas atmosphere such as argon (Ar).

Figure 5A:
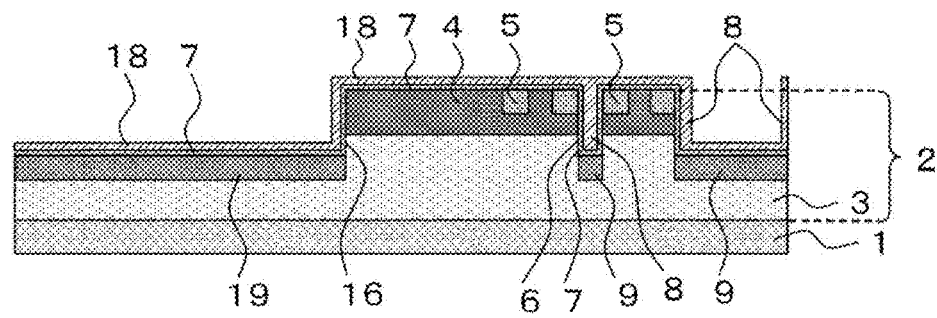
FIGS. 5A to 5D illustrate the method of manufacturing the semiconductor device according to Embodiment 1 of the present invention.

Next, as illustrated in FIG. 5A, a silicon oxide film that becomes the gate insulating film 7 is formed on the surface of the semiconductor layer 2 that includes the inside of the gate trench 6 and the inside of the terminal trench 16. Thereafter, polysilicon that becomes the gate electrode 8 and the gate line 18 is deposited by low pressure CVD.

Figure 5B:
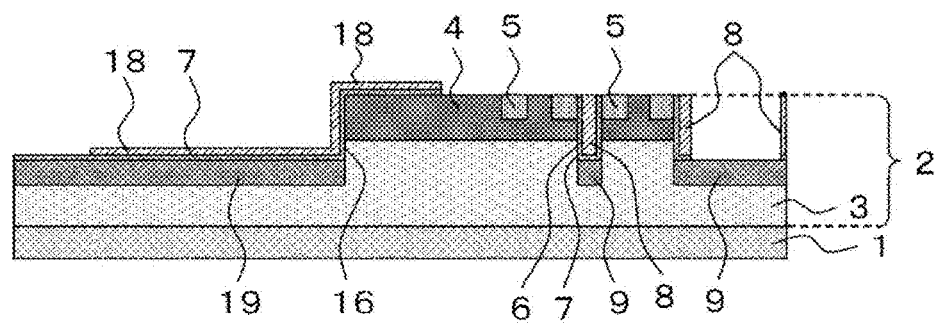

Next, as illustrated in FIG. 5B, the polysilicon is patterned or etched back to form the gate insulating film 7 and the gate electrode 8 in the gate trench 6 and to form the gate insulating film 7 and the gate line 18 in the terminal trench 16. The silicon oxide film that becomes the gate insulating film 7 may be formed by thermally oxidizing the surface of the semiconductor layer 2, or may be deposited on the semiconductor layer 2 by CVD.

Figure 5C:
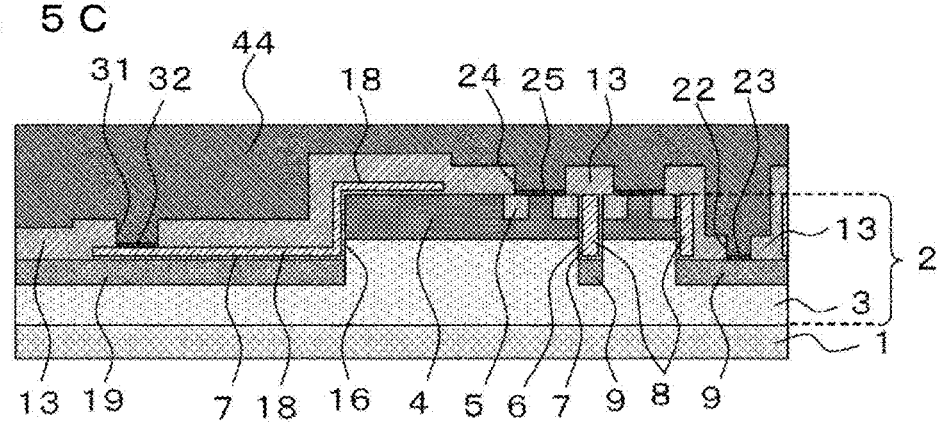

Next, as illustrated in FIG. 5C, the interlayer insulation film 13 is formed on the surface side of the semiconductor layer 2 by low pressure CVD so as to cover the gate electrode 8 and the gate line 18. Then, the interlayer insulation film 13 is patterned to form the contact holes 24 that reach the source region 5 and the base region 4 and the contact holes 22 that reach the diffusion protective layer 9 in the active region. Also, the contact holes 31 that reach the gate line 18 are formed in the terminal region. Thereafter, the ohmic electrodes 25, 23, and 32 are respectively formed in the contact holes 24, 22, and 31. Each ohmic electrode may, for example, be a silicide film that is formed by depositing a metal film composed primarily of nickel (Ni) on the semiconductor layer 2 and the gate line 18 and performing heat treatment at a temperature of 600° C. to 1100° C. to cause a reaction of Ni and the semiconductor. Thereafter, a metal electrode 44 is formed by depositing an Al alloy or the like on the interlayer insulation film 13 and on the inside of the contact holes 24, 22, and 31.

Figure 5D:
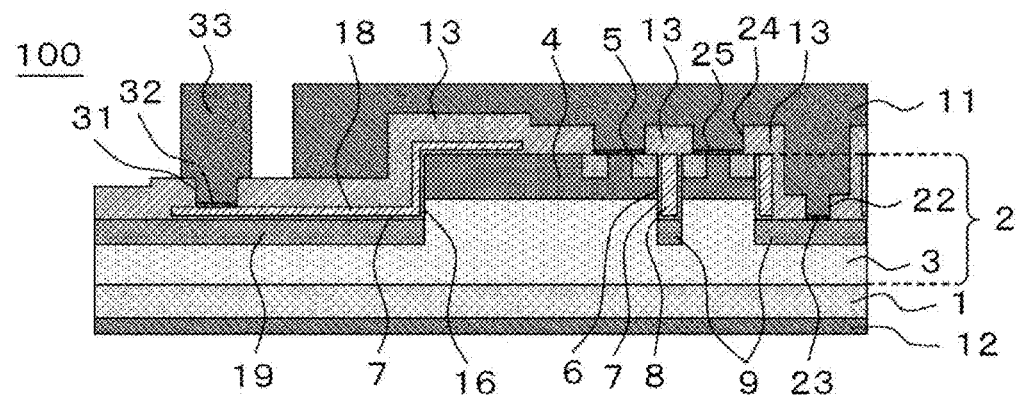

Then, as illustrated in FIG. 5D, the metal electrode 44 is patterned so as to separate the source electrode 11 and the gate pad 33. Then, the drain electrode 12 is formed by depositing an Al alloy or the like on the surface of the silicon carbide semiconductor substrate 1 on the side opposite to the side where the semiconductor layer 2 is formed. Through the steps described above, the semiconductor device 100 is formed.

Next, functions and effects of the semiconductor device 100 according to the present invention will be described.

The semiconductor device 100 according to the present invention illustrated in FIGS. 2A to 2D controls the channel to be formed in the base region 4 that opposes the gate electrode 8 via the gate insulating film 7 and controls ON and OFF states of the semiconductor device 100 by controlling the voltage applied between the gate electrode 8 and the source electrode 11.

When a voltage high enough to turn the semiconductor device 100 on is applied between the gate pad 33 and the source electrode 11, a voltage higher than or equal to a threshold value is applied from the gate pad 33 via the gate line 18 to the gate electrode 8. As a result, a channel is formed in the base region 4 that opposes the gate electrode 8 via the gate insulating film 7, and a path for passing electrons serving as carriers is formed between the n-type source region 5 and the n-type drift layer 3. Then, electrons flowing from the source region 5 into the drift layer 3 are caused to reach the drain electrode 12 via the drift layer 3 and the silicon carbide semiconductor substrate 1 by an electric field created by the voltage applied between the drain electrode 12 and the source electrode 11. As a result, current flows from the drain electrode 12 into the source electrode 11 with the application of a voltage higher than or equal to the threshold value to the gate electrode 8. This state is the ON state of the semiconductor device 100.

On the other hand, in a state where a voltage less than the threshold value is applied between the gate electrode 8 and the source electrode 11, no channel is formed in the base region 4 that opposes the gate electrode 8 via the gate insulating film 7. In this case, the presence of the p-type base region 4 between the n-type source region 5 and the n-type drift layer 3 prevents the flow of current from the drain electrode 12 to the source electrode 11. This state is the OFF state of the semiconductor device 100.

When the semiconductor device 100 is turned off, a high voltage supplied from an external electric circuit is applied between the drain electrode 12 and the source electrode 11. In the off state of the semiconductor device 100, a depletion layer grows from the diffusion protective layer 9 and the terminal protective layer 19 into the drift layer 3. Thus, it is possible to inhibit an electric field created by the voltage applied between the drain electrode 12 and the source electrode 11 from concentrating on the gate insulating film 7 on the bottom of the gate trench 6 and to prevent the electric field from causing a breakdown of the gate insulating film 7 on the bottom of the gate trench 6.

On the other hand, when the semiconductor device 100 is turned on, current flows from the drain electrode 12 to the source electrode 11 with the voltage supplied from the external electrical circuit. Thus, the voltage between the drain electrode 12 and the source electrode 11 serves as an ON-state voltage that is the voltage determined by the on-state resistance of the semiconductor device 100 and the current flowing from the drain electrode 12 to the source electrode 11. The ON-state voltage is much lower than the voltage applied between the drain electrode 12 and the source electrode 11 in the OFF state. Accordingly, the depletion layer that has grown in the OFF state from the diffusion protective layer 9 and the terminal protective layer 19 into the drift layer 3 shrinks toward the diffusion protective layer 9 and the terminal protective layer 19 in the ON state. That is, when the semiconductor device 100 repeatedly switches between ON and OFF states, the depletion layer that extends from the diffusion protective layer 9 and the terminal protective layer 19 to the drift layer 3 grows and shrinks in accordance with the switching. At this time, a displacement current that charges and discharges electrostatic capacitance equivalent to the depletion layer flows to the diffusion protective layer 9 and the terminal protective layer 19 via the source electrode 11.

As illustrated in FIG. 1, the semiconductor device 100 according to the present invention includes a plurality of contact cells 10c in the active region 20. Also, in the semiconductor device according to the present invention, as described previously, the diffusion protective layer 9 and the source electrode 11 may be electrically connected to each other in such a manner that the diffusion protective layer 9 provided at the bottom of the gate trench 6 in contact with the active cells 10a and the outermost cells 10b in the active region is electrically connected to the base region 4 by the p-type semiconductor layer formed in the drift layer 3 adjacent to the side face of the gate trench 6. That is, a displacement current that flows to the diffusion protective layer 9 in the active region in accordance with switching of the semiconductor device 100 flows in from the source electrode 11 or flows out to the source electrode 11 via the contact cells 10c or the p-type semiconductor layer formed in the drift layer 3 adjacent to the side face of the gate trench 6.

In the semiconductor device 100 according to the present invention as illustrated in FIGS. 2A to 2D, the terminal protective layer 19 formed at the bottom of the terminal trench 16 is electrically connected to the source electrode 11 via the junction 11a with the source electrode 11. Therefore, the displacement current that flows to the terminal protective layer 19 in the terminal region in accordance with switching of the semiconductor device 100 flows in from the source electrode 11 or flows out to the source electrode 11 via the junction 11a between the terminal protective layer 19 and the source electrode 11. That is, in the semiconductor device 100 according to the present invention, the displacement current that flows in accordance with switching does not flow into the diffusion protective layer 9 from the terminal protective layer 19 and does not flow into the terminal protective layer 19 from the diffusion protective layer 9.

In the semiconductor device 100 according to the present invention, the gate trench 6 has the extensions 6a that extend from the inner side of the silicon carbide semiconductor substrate 1 to the outer side thereof, and the extensions 6a have a width smaller than the width of the terminal trench 16 located in the extension direction of the extensions 6a. Note that the width of the terminal trench 16 as used herein refers to the length of a portion that is located in the extension direction of the extensions 6a, i.e., the length in the direction parallel to the width of the extensions 6a. Accordingly, the diffusion protective layer 9 formed at the bottom of the gate trench 6 and the terminal protective layer 19 formed at the bottom of the terminal trench 16 also have the same shapes as those of the respective trenches, and the width of the extensions 9a of the diffusion protective layer 9 is smaller than the width of the terminal protective layer 19 located in the extension direction of the extensions 9a. Similarly to the width of the terminal trench 16, the width of the terminal protective layer 19 as used herein refers to the length of a portion that is located in the extension direction of the extensions 9a, i.e., the length in the direction parallel to the width of the extensions 9a.

That is, the electrical resistance of the extensions 9a of the diffusion protective layer 9 is higher than the electrical resistance of the terminal protective layer 19 because the extensions 9a of the diffusion protective layer 9 have a smaller width than the terminal protective layer 19. Also, the extensions 9a of the diffusion protective layer 9 are formed adjacent to the outermost cells 10b and thus located at positions with the greatest distance from the contact cells 10c in the diffusion protective layer 9. That is, the extensions 9a of the diffusion protective layer 9 are portions at which a largest voltage drop occurs due to the displacement current flowing to the diffusion protective layer 9 in accordance with switching and the electrical resistance of the diffusion protective layer 9. Accordingly, a large electric field is applied to the gate insulating film 7 at the bottom of the gate trench 6 adjacent to the extensions 9a of the diffusion protective layer 9 due to a voltage drop caused by the displacement current.

However, in the semiconductor device 100 according to the present invention, the displacement current does not flow into the extensions 9a from the terminal protective layer 19 and does not flow out to the terminal protective layer 19 from the extensions 9a, because the extensions 9a of the diffusion protective layer 9 are separated from the terminal protective layer 19. Thus, the magnitude of the displacement current flowing to the extensions 9a can be reduced as compared with the conventional semiconductor device described in Patent Document 1. Accordingly, it is possible to reduce the voltage drop caused by the displacement current at the extensions 9a of the diffusion protective layer 9 as compared with the conventional semiconductor device, to reduce the electric field applied to the gate insulating film 7 adjacent to the extensions 9a, and to inhibit the electric filed from causing a breakdown of the gate insulating film 7 adjacent to the extensions 9a.

Figure 6A:
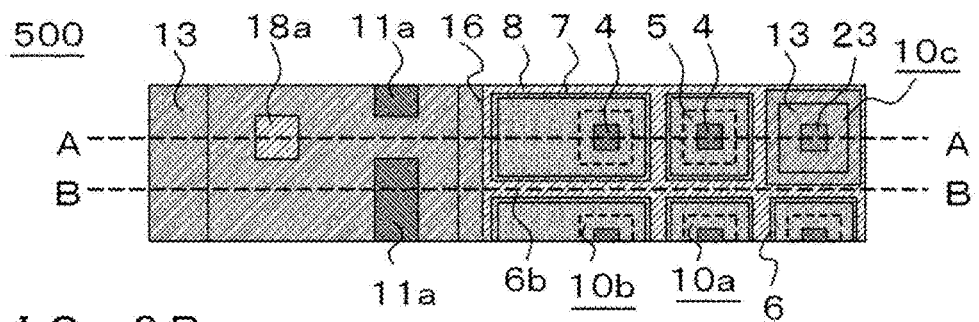
FIGS. 6A and 6B are partial plan views and FIGS. 6C and 6D are partial sectional views each illustrating a configuration of a semiconductor device according to a comparative example.
Figure 6B:
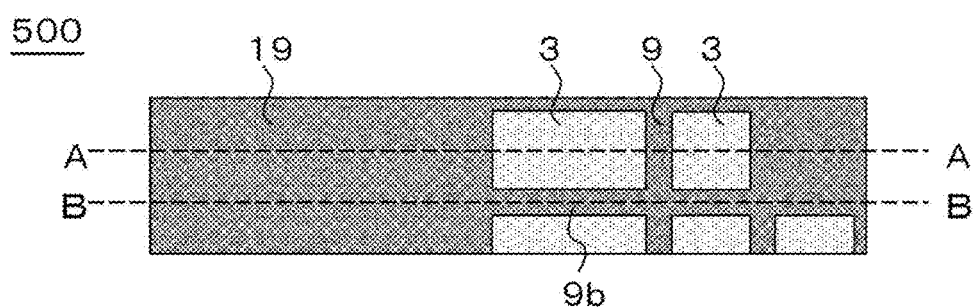
Figure 6C:
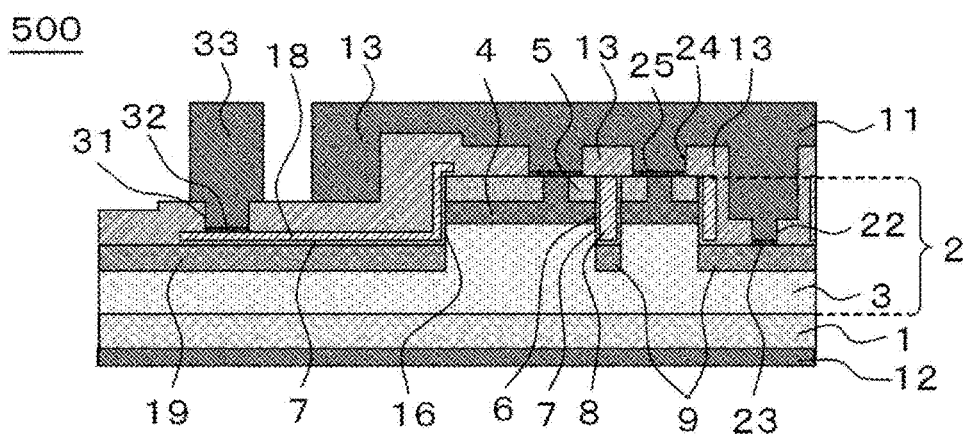
Figure 6D:
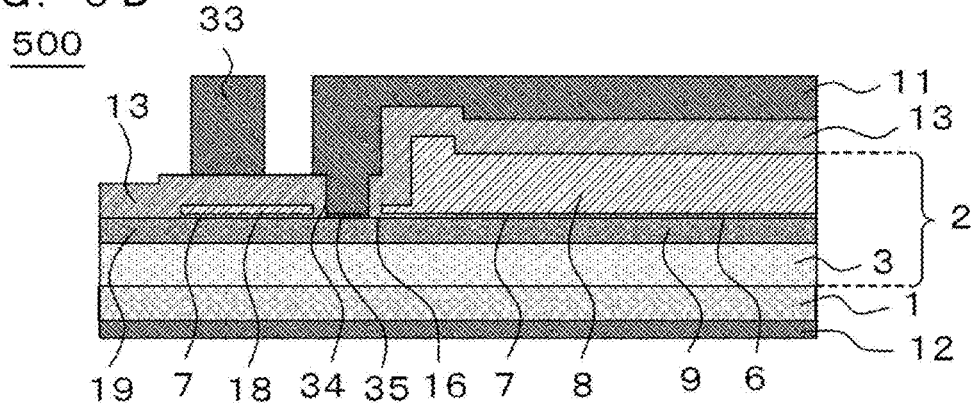

FIGS. 6A and 6B are partial plan views and FIGS. 6C and 6D are partial sectional views each illustrating a configuration of a semiconductor device according to a comparative example. FIGS. 6A to 6D illustrate a region that corresponds to the region illustrated in FIGS. 2A to 2D of Embodiment 1 of the present invention, and illustrates part of the active region and terminal region of a semiconductor device 500 according to a comparative example, the part corresponding to the region enclosed by the broken line 101 in FIG. 1. In FIGS. 6A to 6D, constituent elements given the same reference signs as in FIGS. 2A to 2D indicate identical or corresponding constituent elements, and description thereof has been omitted. The semiconductor device 500 according to the comparative example in FIGS. 6A to 6D differs from the semiconductor device 100 according to the present invention illustrated in FIGS. 2A to 2D in its configuration in which the diffusion protective layer 9 and the terminal protective layer 19 are formed continuously.

FIG. 6A is a partial plan view illustrating the semiconductor device 500 according to the comparative example, taken at the position of the upper surface of the semiconductor layer 2, and FIG. 6B is a partial plan view illustrating the semiconductor device 500 according to the comparative example, taken at the position of the diffusion protective layer 9 at the bottom of the gate trench 6. FIG. 6C is a partial sectional view taken along a broken line A-A in FIGS. 6A and 6B, and FIG. 6D is a partial sectional view taken along a broken line B-B in FIGS. 6A and 6B.

As illustrated in FIGS. 6A and 6D, in the semiconductor device 500 according to the comparative example, the gate trench 6 in the active region and the terminal trench 16 in the terminal region are formed continuously. Also, as illustrated in FIGS. 6C and 6D, the diffusion protective layer 9 is formed at the bottom of the gate trench 6, and the terminal protective layer 19 is formed at the bottom of the terminal trench 16. As illustrated in FIGS. 6B and 6D, the diffusion protective layer 9 and the terminal protective layer 19 are formed continuously.

As illustrated in FIG. 6A, in the semiconductor device 500 according to the comparative example, the gate trench 6 has extensions 6b that extend from the inner side to the outer side, and the extensions 6b are connected at their outer ends to the terminal trench 16. Also, as illustrated in FIG. 6B, in the semiconductor device 500 according to the comparative example, the diffusion protective layer 9 has extensions 9b that extend from the inner side to the outer side, and the extensions 9b are connected at their outer ends to the terminal protective layer 19. The diffusion protective layer 9 and the terminal protective layer 19 are both p-type semiconductor layers, and therefore, they are directly and electrically connected to each other, forming a configuration in which current flows from the terminal protective layer 19 via the extensions 9b to the diffusion protective layer 9. At the connections with the extensions 9b of the diffusion protective layer 9, the terminal protective layer 19 has a greater width than the width of the extensions 9b of the diffusion protective layer 9. Thus, the extensions 9b of the diffusion protective layer 9 have higher electrical resistance per unit length of the path of current flowing from the inner side to the outer side or from the outer side to the inner side than the terminal protective layer 19.

In the semiconductor device 500 according to the comparative example, as in the semiconductor device 100 according to the present invention, the diffusion protective layer 9 in the active region is joined to the source electrode 11 in the contact cells 10c, and the terminal protective layer 19 in the terminal region is joined to the source electrode 11 at the junction 11a. However, the magnitude of equivalent electrostatic capacitance generally differs between a depletion layer formed by the diffusion protective layer 9 and a depletion layer formed by the terminal protective layer 19, and the electric resistance between the diffusion protective layer 9 and the source electrode 11 also generally differs from the electric resistance between the terminal protective layer 19 and the source electrode 11. Accordingly, a time constant required to charge or discharge the capacitance equivalent to the depletion layer formed by the diffusion protective layer 9 and a time constant required to charge or discharge the capacitance equivalent to the depletion layer formed by the terminal protective layer 19 vary depending on the displacement current generated by switching of the semiconductor device 100, and a displacement current flows from the terminal protective layer 19 to the diffusion protective layer 9 or from the diffusion protective layer 9 to the terminal protective layer 19.

As a result, the displacement current flowing in from the terminal protective layer 19 or the displacement current flowing out to the terminal protective layer 19 flows to the extensions 9b of the diffusion protective layer 9 in the semiconductor device 500 according to the comparative example. This causes a larger voltage drop at the extensions 9b of the diffusion protective layer 9 than in the semiconductor device 100 according to the present invention, causes an excessive electric field to be applied to the gate insulating film 7 at the bottom of the gate trench 6 adjacent to the extensions 9b of the diffusion protective layer 9, and easily causes a breakdown of the gate insulating film 7 adjacent to the extensions 9b.

In contrast, in the semiconductor device 100 according to the present invention, the displacement current does not flow into the diffusion protective layer 9 from the terminal protective layer 19 and does not flow out of the diffusion protective layer 9 to the terminal protective layer 19 through the extensions 9a of the diffusion protective layer 9, because the extensions 9a of the diffusion protective layer 9 in the active region are formed separately from the terminal protective layer 19 in the terminal region. As a result, it is possible to reduce a voltage drop occurring at the extensions 9a of the diffusion protective layer 9, to suppress the application of an excessive electric field to the gate insulating film 7 at the bottom of the gate trench 6 adjacent to the extensions 9a, and to suppress a breakdown of the gate insulating film 7.

In particular, if the distance between the junction 11a between the source electrode 11 and the terminal protective layer 19 and a contact cell 10c having a closest distance to this junction 11a is greater than the distance between this contact cell 10c and another contact cell 1c having a closest distance to that contact cell 10c, an excessive voltage drop can occur at the connection between the diffusion protective layer 9 and the terminal protective layer 19. In such a case, in the semiconductor device 500 according to the comparative example, a breakdown of the gate insulating film 7 adjacent to the extensions 9b is more likely to occur because a further excessive voltage drop occurs at the extensions 9b of the diffusion protective layer 9. In contrast, the semiconductor device 100 according to the present invention is more effective because it can suppress the flow of an excessive displacement current to the extensions 9a of the diffusion protective layer 9 and suppress a breakdown of the gate insulating film 7.

As described above, the semiconductor device 100 according to Embodiment 1 of the present invention separates the diffusion protective layer 9 provided at the bottom of the gate trench 6 from the terminal protective layer 19 provided at the bottom of the terminal trench 16, and electrically connects the diffusion protective layer 9 and the terminal protective layer 19 by the source electrode 11. Thus, it is possible to prevent the displacement current from flowing into the diffusion protective layer 9 from the terminal protective layer 19 and to inhibit the displacement current from causing an excessive electric field at the bottom of the gate trench 6 and a breakdown of the gate insulating film 7.

Embodiment 2

Figure 7A:
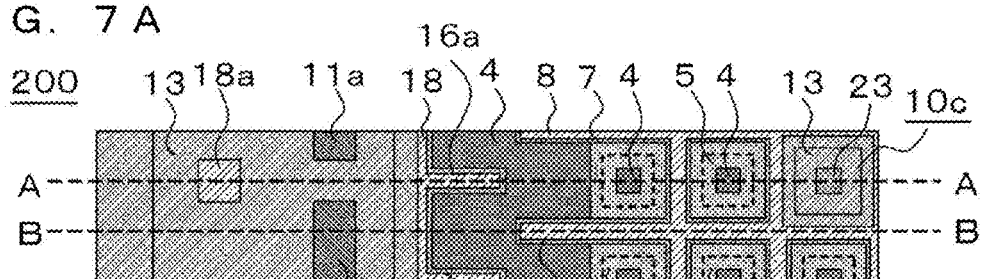
FIGS. 7A and 7B are partial plan views and FIGS. 7C and 7D are partial sectional views each illustrating a semiconductor device according to Embodiment 2 of the present invention.
Figure 7B:
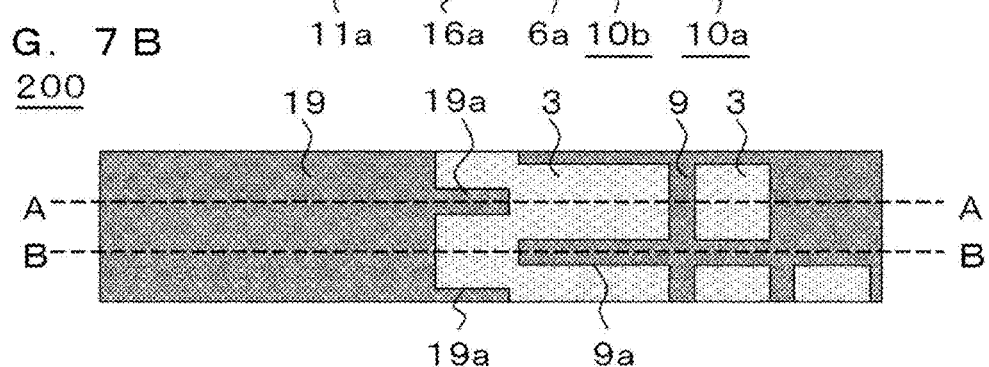
Figure 7C:
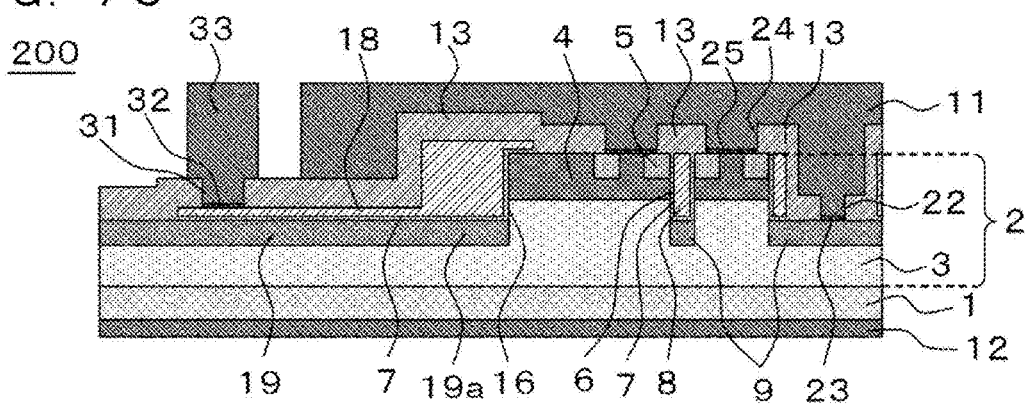
Figure 7D:
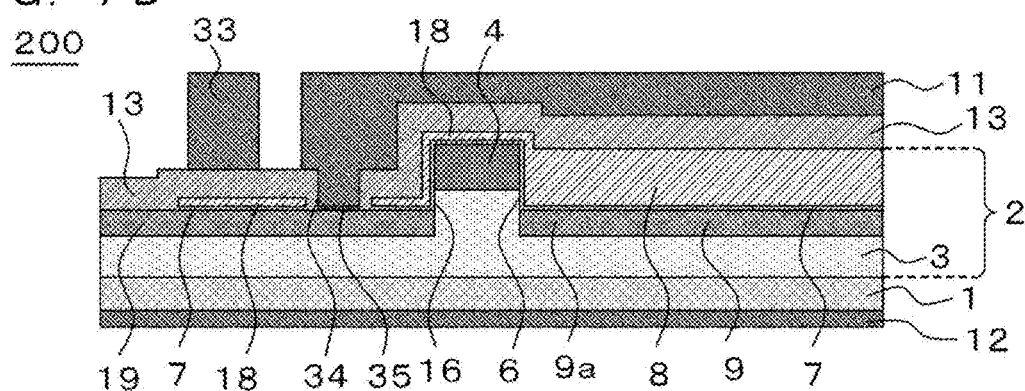

FIGS. 7A and 7B are partial plan views and FIGS. 7C and 7D are partial sectional views each illustrating a semiconductor device according to Embodiment 2 of the present invention. FIGS. 7A to 7D are diagrams that corresponds to FIGS. 2A to 2D according to Embodiment 1. In FIGS. 7A to 7D, constituent elements given the same reference signs as in FIGS. 2A to 2D indicate identical or corresponding constituent elements, and description thereof has been omitted. Embodiment 2 differs from Embodiment 1 of the present invention in its configuration in which the terminal protective layer 19 provided in the terminal region has extensions 19a that extend from the outer side of the silicon carbide semiconductor substrate 1 to the inner side thereof.

FIG. 7A is a partial plan view illustrating the semiconductor device 200 taken at the position of the upper surface of the semiconductor layer 2, and FIG. 7B is a partial plan view illustrating the semiconductor device 200 taken at the position of the diffusion protective layer 9 at the bottom of the gate trench 6. FIG. 7C is a partial sectional view taken along a broken line A-A in FIGS. 7A and 7B, and FIG. 7D is a partial sectional view taken along a broken line B-B in FIGS. 7A and 7B.

As illustrated in FIGS. 7A and 7B, in the semiconductor device 200 according to Embodiment 2 of the present invention, the terminal trench 16 has extensions 16a that extend from the outer side of the silicon carbide semiconductor substrate 1 to the inner side thereof, and the terminal protective layer 19 formed at the bottom of the terminal trench 16 has extensions 19a that extend from the outer side of the silicon carbide semiconductor substrate 1 to the inner side thereof. The terminal trench 16 has a plurality of extensions 16a, and the terminal protective layer 19 has a plurality of extensions 19a. In the active region, the gate trench 6 has a plurality of extensions 6a, and the diffusion protective layer 9 has a plurality of extensions 9a as described in Embodiment 1. The extensions 19a of the terminal protective layer 19 extend toward spaces between the plurality of extensions 9a of the diffusion protective layer 9, and the extensions 9a of the diffusion protective layer 9 extend toward spaces between the plurality of extensions 19a of the terminal protective layer 19. That is, the extensions 19a of the terminal protective layer 19 and the extensions 9a of the diffusion protective layer 9 are alternately provided in a direction perpendicular to the extension direction of the respective extensions.

Although FIGS. 7A to 7D illustrates a configuration in which the tips of the extensions 19a of the terminal protective layer 19 are located more toward the outer side of silicon carbide semiconductor substrate 1 than the tips of the extensions 9a of the diffusion protective layer 9, a configuration is also possible in which the extensions 19a of the terminal protective layer 19 are further extended toward the inner side of the silicon carbide semiconductor substrate 1 so that the tips of the extensions 19a of the terminal protective layer 19 are located more toward the inner side of the silicon carbide semiconductor substrate 1 than the tips of the extensions 9a of the diffusion protective layer 9. In the semiconductor device 100 according to Embodiment 1, the inner end of the terminal protective layer 19 needs to be located more toward the outer side than the tips of the extensions 9a of the diffusion protective layer 9 because the inner end of the terminal protective layer 19 is linear. Thus, a region where the p-type protective layer is absent is generated between the diffusion protective layer 9 and the terminal protective layer 19. This may reduce the thickness of a depletion layer between the diffusion protective layer 9 and the terminal protective layer 19 and reduce the avalanche voltage.

The semiconductor device 200 according to Embodiment 2 of the present invention, in which the terminal protective layer 19 has the extensions 19a extending from the outer side to the inner side, can reduce the area of the region where the p-type protective layer is absent between the diffusion protective layer 9 and the terminal protective layer 19 and can suppress a reduction in the thickness of the depletion layer between the diffusion protective layer 9 and the terminal protective layer 19. Thus, it is possible to suppress a reduction in the thickness of the depletion layer. In particular, with the configuration in which the extensions 19a of the terminal protective layer 19 extend toward the spaces between the plurality of extensions 9a of the diffusion protective layer 9, it is possible to locate the tips of the extensions 19a of the terminal protective layer 19 more toward the inner side than the tips of the extensions 9a of the diffusion protective layer 9 and to substantially eliminate a region where the thickness of the depletion layer is reduced. As a result, a reduction in avalanche voltage can be suppressed, and the withstand voltage of the semiconductor device 200 can be improved.

Embodiment 3

Figure 8A:
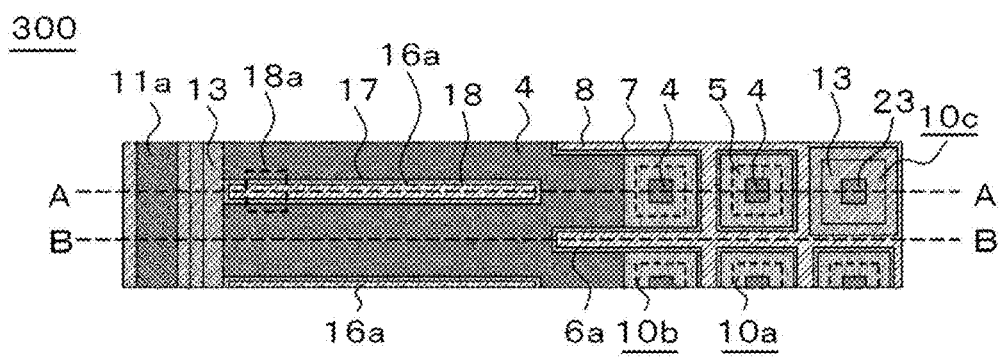
FIGS. 8A and 8B are partial plan views and FIGS. 8C and 8D are partial sectional views each illustrating a semiconductor device according to Embodiment 3 of the present invention.
Figure 8B:
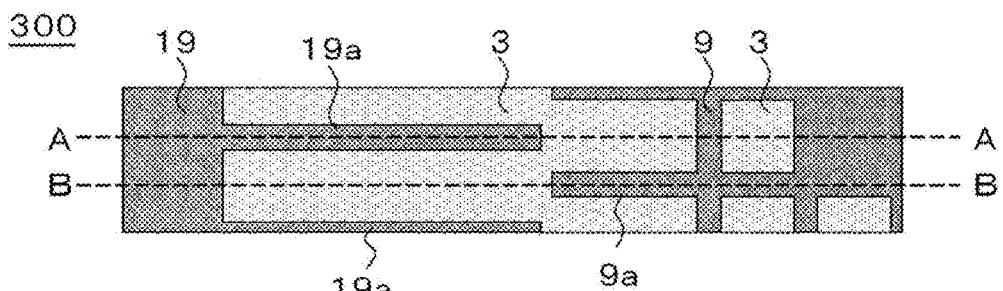
Figure 8C:
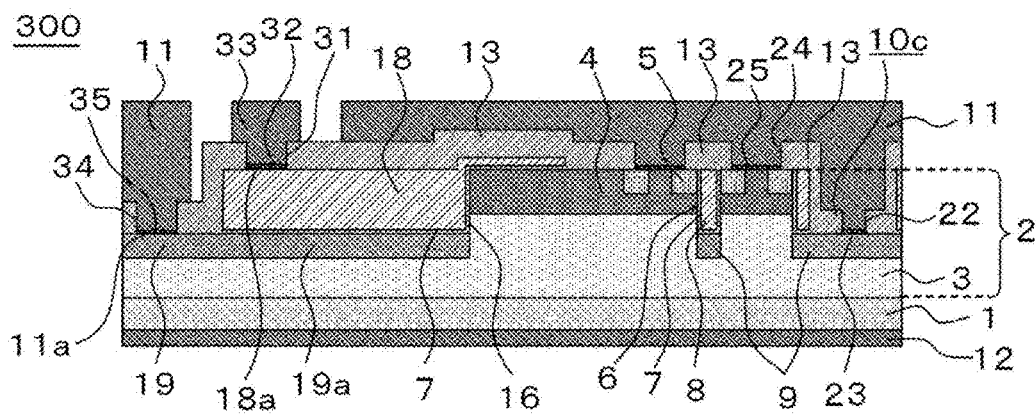
Figure 8D:
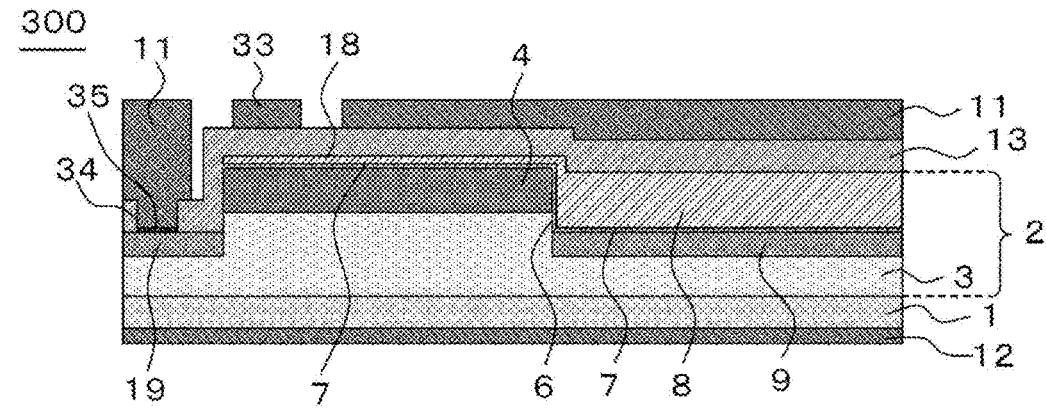

FIGS. 8A and 8B are partial plan views and FIGS. 8C and 8D are partial sectional views each illustrating a semiconductor device according to Embodiment 3 of the present invention. FIGS. 8A to 8D are diagrams that corresponds to FIGS. 2A to 2D according to Embodiment 1. In FIGS. 8A to 8D, constituent elements given the same reference signs as in FIGS. 2A to 2D indicate identical or corresponding constituent elements, and description thereof has been omitted. Embodiment 3 differs from Embodiment 1 of the present invention in its configuration in which the source electrode 11 is provided more toward the outer side of the silicon carbide semiconductor substrate 1 than the gate pad 33.

FIG. 8A is a partial plan view illustrating a semiconductor device 300 taken at the position of the upper surface of the semiconductor layer 2, and FIG. 8B is a partial plan view illustrating the semiconductor device 300 taken at the position of the diffusion protective layer 9 at the bottom of the gate trench 6. FIG. 8C is a partial sectional view taken along a broken line A-A in FIGS. 8A and 8B, and FIG. 8D is a partial sectional view taken along a broken line B-B in FIGS. 8A and 8B.

As illustrated in FIGS. 8A and 8C, in the semiconductor device 300 according to Embodiment 3 of the present invention, the junction 11a between the terminal protective layer 19 and the source electrode 11 is located more toward the outer side of the silicon carbide semiconductor substrate 1 than the junction 18a between the gate line 18 and the gate pad 33. The junction 11a between the terminal protective layer 19 and the source electrode 11 is formed in an endless ring shape in the terminal region of the semiconductor device 300. Although FIG. 8C illustrates a configuration in which the source electrode 11 joined to the terminal protective layer 19 is separated from the source electrode 11 joined to the diffusion protective layer 9 in the contact cells 10c, the gate pad 33 is provided in only part of the terminal region, and in a section along which the gate pad 33 is not provided in the terminal region, the source electrode 11 joined to the terminal protective layer 19 and the source electrode 11 joined to the diffusion protective layer 9 in the contact cells 10c are continuously connected to each other.

As illustrated in FIG. 8B, the diffusion protective layer 9 in the active region has the extensions 9a that extend from the inner side to the outer side, and the tips of the extensions 9a are separated from the terminal protective layer 19 formed at the bottom of the terminal trench 16. Although the terminal protective layer 19 has the extensions 19a extending from the outer side to the inner side in the semiconductor device 300 illustrated in FIGS. 8A to 8D, the terminal protective layer 19 may be configured not to have the extensions 19a.

As illustrated in FIGS. 8A to 8D, even in the semiconductor device 300 in which the junction 11a between the terminal protective layer 19 and the source electrode 11 is formed in an endless ring shape in the terminal region, the displacement current flowing to the terminal protective layer 19 in accordance with switching is prevented from flowing into the diffusion protective layer 9. Thus, it is possible to suppress the occurrence of an excessive voltage drop at the extensions 9a of the diffusion protective layer 9 and inhibit an electric field from causing a breakdown of the gate insulating film 7 adjacent to the extensions 9a of the diffusion protective layer 9.

Embodiment 4

Figure 9A:
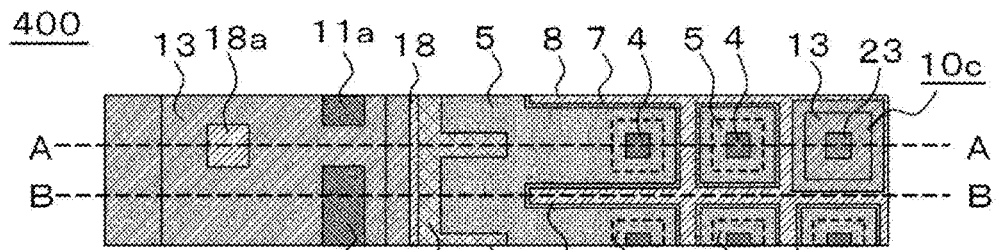
FIGS. 9A and 9B are partial plan views and FIGS. 9C and 9D are partial sectional views each illustrating a semiconductor device according to Embodiment 4 of the present invention.
Figure 9B:
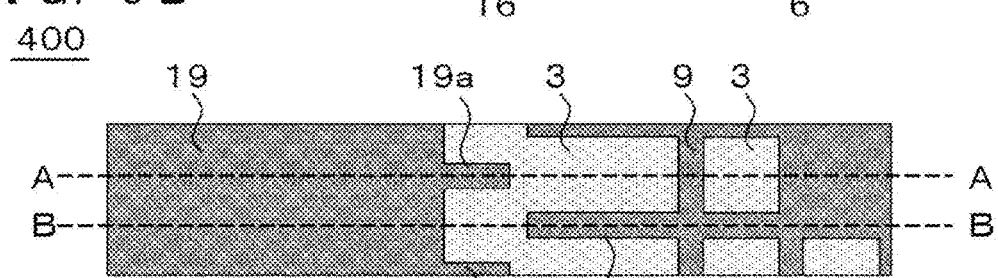
Figure 9C:
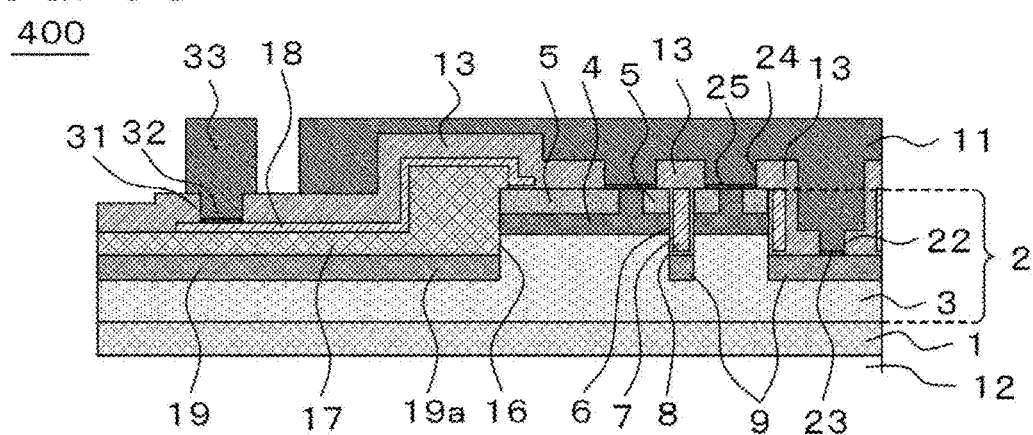
Figure 9D:
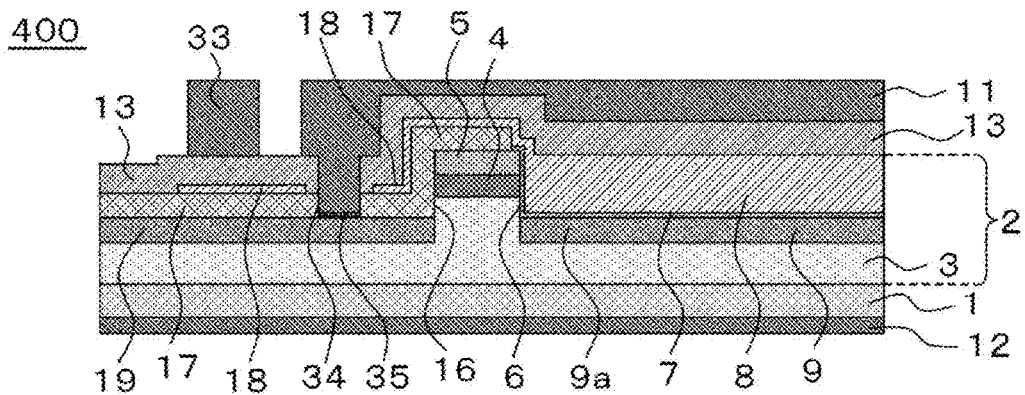
Figure 10:
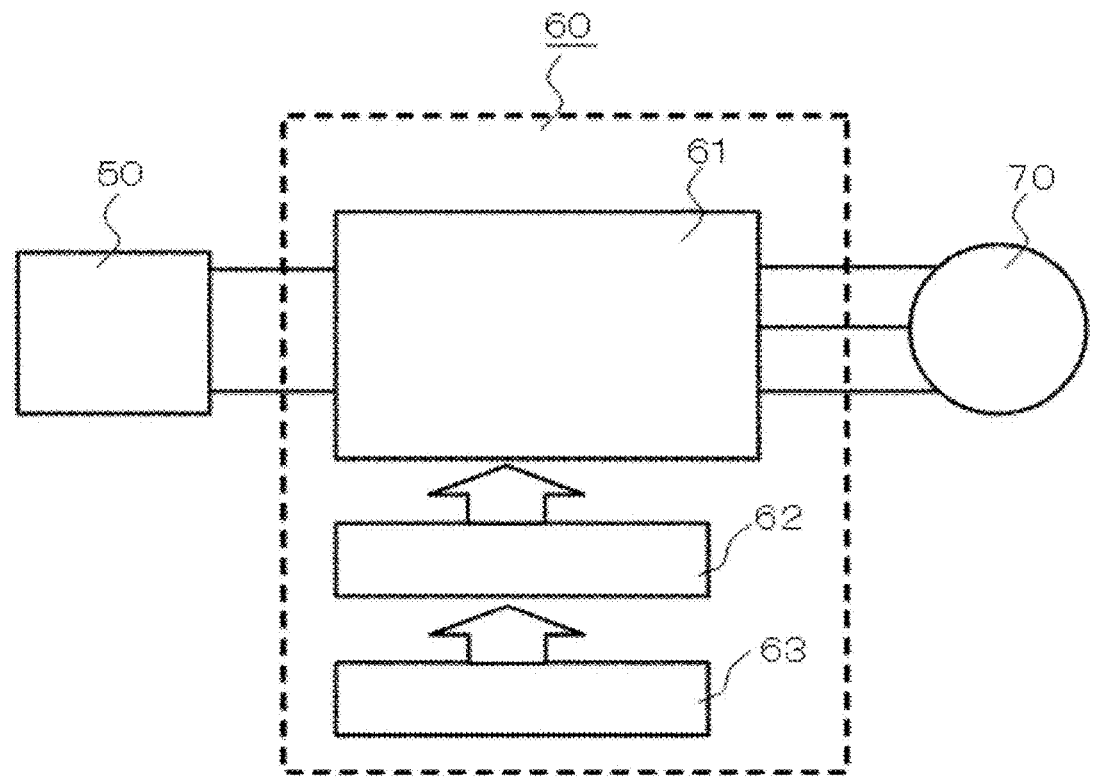
FIG. 10 is a block diagram illustrating a configuration of a power conversion system that applies a power converter according to Embodiment 5 of the present invention.

FIGS. 9A and 9B are partial plan views and FIGS. 9C and 9D are partial sectional views each illustrating a semiconductor device according to Embodiment 4 of the present invention. FIGS. 9A to 9D are diagrams that corresponds to FIGS. 2A to 2D according to Embodiment 1. In FIGS. 9A to 9D, constituent elements given the same reference signs as in FIGS. 2A to 2D indicate identical or corresponding constituent elements, and description thereof has been omitted. Embodiment 4 differs from Embodiment 1 of the present invention in its configuration in which a field insulating film 17 is provided between the terminal protective layer 19 and the gate line 18 in the terminal region, and the field insulating film 17 is provided continuously from the terminal region to the top of the source region 5 in the active region.

FIG. 9A is a partial plan view illustrating a semiconductor device 400 taken at the position of the upper surface of the semiconductor layer 2, and FIG. 9B is a partial plan view illustrating the semiconductor device 400 taken at the position of the diffusion protective layer 9 at the bottom of the gate trench 6. FIG. 9C is a partial sectional view taken along a broken line A-A in FIGS. 9A and 9B, and FIG. 9D is a partial sectional view taken along a broken line B-B in FIGS. 9A and 9B.

As illustrated in FIG. 9A, in the semiconductor device 400 according to Embodiment 4 of the present invention, the source region 5 in the outermost cell 10b is formed to the outermost side of the active region, and the source region 5 in the outermost cell 10b is in contact with the terminal trench 16. Then, as illustrated in FIGS. 9C and 9D, the field insulating film 17 having a greater film thickness than the gate insulating film 7 is formed on the bottom inside the terminal trench 16, and the gate line 18 provided in the terminal region is provided via the field insulating film 17 on the terminal protective layer 19 adjacent to the bottom of the terminal trench 16. The field insulating film 17 is also formed on the side face on the active region side of the terminal trench 16 and formed continuously to the top of the source region 5 in the outermost cell 10b adjacent to the terminal trench 16. Although FIGS. 9A to 9D illustrate the configuration of the semiconductor device 400 according to Embodiment 4 of the present invention in which the terminal protective layer 19 has the extensions 19a extending from the outer side to the inner side as in the semiconductor device 200 according to Embodiment 2, a configuration is also possible in which the terminal protective layer 19 does not have extensions as in the semiconductor device 100 according to Embodiment 1.

The semiconductor device 400 according to Embodiment 4 of the present invention can be manufactured by adding a step of forming the field insulating film 17 between the step of forming the gate insulating film 7 and the step of forming the gate electrode 8 and the gate line 18 to the method of manufacturing the semiconductor device 100 described in Embodiment 1. The field insulating film 17 may be formed by depositing an insulation film such as a silicon oxide film by CVD while masking a region where the field insulating film 17 is not to be formed.

The semiconductor device 400 according to Embodiment 4 of the present invention includes the field insulating film 17 that is formed between the terminal protective layer 19 and the gate line 18 on the terminal protective layer 19 and that has a greater film thickness than the gate insulating film 7. Even if a displacement current flows to the terminal protective layer 19 in accordance with switching and an excessive voltage drop occurs, the great thickness of the field insulating film 17 helps preventing the occurrence of a breakdown of the field insulating film 17 due to an electric field and further improving the withstand voltage of the semiconductor device 400.

In the semiconductor device 400 illustrated in FIGS. 9A to 9D, the source region 5 in the outermost cell 10b is in contact with the terminal trench 16. Thus, the reliability of the insulation film on the side face of the terminal trench 16 in contact with the active region is likely to deteriorate as compared with the semiconductor devices described in Embodiments 1 to 3. Accordingly, in the case where the gate insulating film 7 is formed on the side face of the terminal trench 16 in contact with the active region so as to keep insulation from the gate line 18 as in the semiconductor devices described in Embodiments 1 to 3, the source region 5 in the outermost cell 10b has to be formed apart from the side face of the terminal trench 16.

However, in the semiconductor device 400 according to Embodiment 4 of the present invention, the field insulating film 17 is formed continuously from the side face on the active region side of the terminal trench 16 to the top of the source region 5 in the outermost cell 10b adjacent to the terminal trench 16. Thus, a dielectric breakdown of the field insulating film 17 is less likely to occur, and the reliability of the semiconductor device 400 can be increased. Accordingly, the source region 5 in the outermost cell 10b can be formed to a position in contact with the terminal trench 16. As a result, in the method of manufacturing the semiconductor device 400, the source region 5 can be formed by selectively leaving the source region 5. i.e., by implanting N ions in the entire upper portion of the base region 4 and then implanting Al ions again in portions other than a portion that is to be left as the source region 5 so as to turn these portions back to the p-type semiconductor. That is, it is possible to simplify the manufacturing process in the case of manufacturing a semiconductor device that reduces contact resistance between the base region 4 and the source electrode by setting the p-type impurity concentration of a portion of the base region 4 that is joined to the source electrode higher than the p-type impurity concentration of a portion of the base region 4 that is in contact with the drift layer 3.

Embodiment 5

Embodiment 5 of the present invention applies the semiconductor devices according to Embodiments 1 to 4 described above to switching elements used in power converters. Although the present invention is not particularly limited to a specific power converter, Embodiment 5 is hereinafter described taking the example of the case where the present invention is applied to a three-phase inverter.

FIGS. 10A to 10D are diagrams illustrating a configuration of a power conversion system that applies the power converter according to Embodiment 5 of the present invention.

The power conversion system illustrated in FIGS. 10A to 10D is configured by a power supply 50, a power converter 60, and a load 70. The power supply 50 is a direct-current power supply and supplies direct-current power to the power converter 60. The power supply 50 may be configured by various constituent elements such as a direct-current system, a solar cell, and a storage battery, or may be configured by a rectifier circuit or an AC/DC converter that is connected to an alternating-current system. The power supply 50 may also be configured by a DC/DC converter that converts direct-current power output from a direct-current system into predetermined power.

The power converter 60 is a three-phase inverter connected between the power supply 50 and the load 70, and converts direct-current power supplied from the power supply 50 into alternating-current power and supplies the alternating-current power to the load 70. As illustrated in FIGS. 10A to 10D, the power converter 60 includes a main converter circuit 61 that converts direct-current power into alternating-current power and outputs the alternating-current power, a drive circuit 62 that outputs a drive signal for driving each switching element of the main converter circuit 61, and a control circuit 63 that outputs a control signal for controlling the drive circuit 62 to the drive circuit 62.

The load 70 is a three-phase electric motor that is driven by the alternating-current power supplied from the power converter 60. Note that the use of the load 70 is not limited to specific applications. The load 70 is an electric motor mounted on various types of electrical apparatuses and, for example, may be used as an electric motor for hybrid automobiles, electric automobiles, railway vehicles, elevators, or air conditioners.

The details of the power converter 600 will be described hereinafter. The main converter circuit 61 includes switching elements and freewheeling diode (not shown) and converts direct-current power supplied from the power supply 50 into alternating-current power and supplies the alternating-current power to the load 70 by switching the switching elements. In the case where the switching elements are MOSFETs, the main converter circuit 61 may be configured without including freewheeling diodes. The main converter circuit 61 may take various types of specific circuit configurations. The main converter circuit 61 according to the present embodiment is a two-level three-phase full-bridge circuit and can be configured by six switching elements and six freewheeling diodes that are respectively connected in anti-parallel with the six switching elements. The semiconductor device according to one of Embodiments 1 to 4 described above is applied to each switching element of the main converter circuit 61. Each two of the six switching elements are connected in series and constitute upper and lower arms, and each pair of upper and lower arms constitutes each phase (U phase, V phase, or W phase) of the full-bridge circuit. The output terminals of each pair of upper and lower arms, i.e., three output terminals of the main converter circuit 61, are connected to the load 70.

The drive circuit 62 generates drive signals for driving the switching elements of the main converter circuit 61 and supplies the drive signals to the gate electrode via the gate pads of the switching elements of the main converter circuit 61. Specifically, the drive circuit 62 outputs a drive signal for turning a switching element on and a drive signal for turning a switching element off to the gate electrode of each switching element in accordance with the control signal received from the control circuit 63, which will be described later. In the case of maintaining a switching element in the ON state, the drive signal is a voltage signal (ON signal) greater than or equal to the threshold voltage of the switching element. In the case of maintaining a switching element in the OFF state, the drive signal is a voltage signal (OFF signal) less than or equal to the threshold voltage of the switching element.

The control circuit 63 controls the switching elements of the main converter circuit 61 so that desired power is supplied to the load 70. Specifically, the control circuit 63 calculates a time (ON time) when each switching element of the main converter circuit 61 is turned on, on the basis of power that is to be supplied to the load 70. For example, the control circuit 63 can control the main converter circuit 61 by PWM control in which the ON time of each switching element is modulated in accordance with the voltage that is to be output. Then, the control circuit 63 outputs a control command (control signal) to the drive circuit 62 so that an ON signal is output to a switching element at each time when the switching element is turned on, and an OFF signal is output to a switching element at each time when the switching element is turned off. In accordance with this control signal, the drive circuit 62 outputs either an ON signal or an OFF signal as a drive signal to the gate electrode of each switching element via the gate pad of the switching element.

The power converter according to the present embodiment that applies one of the semiconductor devices according to Embodiments 1 to 4 to each switching element of the main converter circuit 61 can suppress a breakdown and failure of the gate insulating film of the semiconductor device and can improve the reliability of the power converter.

Although the present embodiment describes an example in which the present invention is applied to a two-level three-phase inverter, the present invention is not limited to this example and is applicable to various types of power converters. Although the present embodiment describes a two-level power converter as an example, the power converter may be a three-level or mulita-level power converter, and the present invention may be applied to a single-phase inverter when power is supplied to a single-phase load. In the case where power is supplied to a direct-current load or the like, the present invention is also applicable to a DC/DC converter or an AC/DC converter.

The use of the power converter according to the present embodiment is not limited to the case where the aforementioned load is an electric motor. The power converter may be used as, for example, a power supply device for electric discharge machines or laser beam machines or for dielectric heating cooking appliances or non-contact power supply systems. The power converter may also be used as a power conditioner in systems such as photovoltaic power generating systems or condenser systems.

EXPLANATION OF REFERENCE SIGNS

1 Silicon carbide semiconductor substrate
2 Semiconductor layer
3 Drift layer
4 Base region
5 Source region
6 Gate trench
6*a* Extension
7 Gate insulating film
8 Gate electrode
9 Diffusion protective layer
9*a* Extension
10*a* Active cell
10*b* Outermost cell
10*c* Contact cell
11 Source electrode
11*a* Junction
13 Interlayer insulation film
16 Terminal trench
16*a* Extension
17 Field insulating film
18 Gate line
18*a* Junction
19 Terminal protective layer
19*a* Extension
20 Active region
30 Terminal region
60 Power converter
61 Main converter circuit
62 Drive circuit
63 Control circuit
100, 110, 200, 300, 400 Semiconductor device

The invention claimed is:

1. A semiconductor device comprising:
a semiconductor substrate;
a drift layer of a first conductivity type provided on the semiconductor substrate;
a base region of a second conductivity type provided on the drift layer;
a source region of the first conductivity type provided in an upper portion of the base region;
a gate electrode provided in a gate trench that penetrates the source region and the base region and reaches the drift layer;
a gate insulating film provided between a bottom face of the gate trench and the gate electrode;
a diffusion protective layer of the second conductivity type provided below the gate insulating film;
an insulation film provided on a bottom face of a terminal trench that is located more toward the outer side of the semiconductor substrate than the gate trench;
a gate line provided on the insulation film and electrically connected to the gate electrode;
a gate pad joined to the gate line in the terminal trench;
a terminal protective layer of the second conductivity type provided below the insulation film; and
a source electrode electrically connected to the source region, the diffusion protective layer, and the terminal protective layer,
wherein the diffusion protective layer has a first extension that extends toward the terminal protective layer, and the first extension is separated from the terminal protective layer.

2. The semiconductor device according to claim 1, wherein
the diffusion protective layer has a grid shape or a stripe shape in plan view.

3. The semiconductor device according to claim 1, wherein
an extension of the gate trench that is located above the first extension is separated from the terminal trench.

4. The semiconductor device according to claim 1, wherein
an outer end of the first extension is located more toward the outer side of the semiconductor substrate than the source region adjacent to the first extension in plan view.

5. The semiconductor device according to claim 1, wherein
the first extension of the diffusion protective layer includes a plurality of first extensions,
the terminal protective layer has a second extension that extends toward a space between the plurality of first extensions.

6. The semiconductor device according to claim 1, wherein
the terminal protective layer is joined to the source electrode and electrically connected only via the source electrode to the diffusion protective layer.

7. The semiconductor device according to claim 1, comprising:
a first junction at which the source electrode is joined to the diffusion protective layer, and a second junction at which the source electrode is joined to the terminal protective layer,
wherein the first junction includes a plurality of first junctions, and a distance between the second junction and a nearest-neighbor first junction that is closest to the second junction among the plurality of first junctions is greater than a distance between the nearest-neighbor first junction and another first junction that is closest to the nearest-neighbor first junction in plan view.

8. The semiconductor device according to claim 1, wherein
the insulation film is a field insulating film that has a greater film thickness than the gate insulating film and that is provided continuously from the bottom face of the terminal trench to a top of the source region.

9. The semiconductor device according to claim 1, wherein
a length between the bottom face of the terminal trench and the semiconductor substrate is less than or equal to a length between the bottom face of the gate trench and the semiconductor substrate.

10. The semiconductor device according to claim 1, wherein
the drift layer is configured by a wide bandgap semiconductor having a wider bandgap than silicon.

11. A power converter comprising:
a main converter circuit that includes the semiconductor device according to claim 1 and that converts and outputs input electric power;
a drive circuit that outputs a drive signal for driving the semiconductor device to the semiconductor device; and
a control circuit that outputs a control signal for controlling the drive circuit to the drive circuit.

* * * * *